(12) United States Patent
Ching et al.

(10) Patent No.: US 9,443,856 B2
(45) Date of Patent: Sep. 13, 2016

(54) SEMICONDUCTOR DEVICE AND FABRICATING THE SAME

(71) Applicant: Taiwan Semiconductor Manufacturing Company, Ltd., Hsin-Chu (TW)

(72) Inventors: Kuo-Cheng Ching, Zhubei (TW); Ting-Hung Hsu, Miaoli (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/918,223

(22) Filed: Oct. 20, 2015

(65) Prior Publication Data

US 2016/0043085 A1 Feb. 11, 2016

Related U.S. Application Data

(62) Division of application No. 13/957,500, filed on Aug. 2, 2013, now Pat. No. 9,171,843.

(51) Int. Cl.
*H01L 27/088* (2006.01)
*H01L 29/775* (2006.01)
(Continued)

(52) U.S. Cl.
CPC ..... *H01L 27/092* (2013.01); *H01L 21/823431* (2013.01); *H01L 21/823821* (2013.01);
(Continued)

(58) Field of Classification Search
CPC .......... H01L 21/823807; H01L 21/0228; H01L 21/823821; H01L 21/845; H01L 29/42392
USPC ............ 257/190, E21.409, E27.062, 369; 438/270
See application file for complete search history.

(56) References Cited

U.S. PATENT DOCUMENTS

2006/0240622 A1* 10/2006 Lee ............... H01L 29/42392
438/257
2007/0040235 A1* 2/2007 Chan ............. H01L 21/76229
257/510
(Continued)

FOREIGN PATENT DOCUMENTS

WO WO2013095646 A1 6/2013
WO WO2014/018201 A1 1/2014

OTHER PUBLICATIONS

Korean Office Action Issued Jul. 13, 2015 in Patent Application No. 10-2014-0099166 filed Aug. 1, 2014.
(Continued)

*Primary Examiner* — Kimberly Rizkallah
*Assistant Examiner* — Brian Turner
(74) *Attorney, Agent, or Firm* — Haynes and Boone, LLP

(57) ABSTRACT

The present disclosure provides a method for fabricating an integrated circuit device. The method includes providing a precursor including a substrate having first and second metal-oxide-semiconductor (MOS) regions. The first and second MOS regions include first and second gate regions, semiconductor layer stacks, and source/drain regions respectively. The method further includes laterally exposing and oxidizing the semiconductor layer stack in the first gate region to form first outer oxide layer and inner nanowire set, and exposing the first inner nanowire set. A first high-k/metal gate (HK/MG) stack wraps around the first inner nanowire set. The method further includes laterally exposing and oxidizing the semiconductor layer stack in the second gate region to form second outer oxide layer and inner nanowire set, and exposing the second inner nanowire set. A second HK/MG stack wraps around the second inner nanowire set.

20 Claims, 27 Drawing Sheets

(51) Int. Cl.
*H01L 29/06* (2006.01)
*H01L 29/78* (2006.01)
*H01L 21/28* (2006.01)
*H01L 21/336* (2006.01)
*H01L 27/092* (2006.01)
*H01L 21/8238* (2006.01)
*H01L 21/8234* (2006.01)
*H01L 29/423* (2006.01)
*H01L 29/786* (2006.01)
*H01L 29/10* (2006.01)
*H01L 29/16* (2006.01)
*H01L 29/161* (2006.01)

(52) U.S. Cl.
CPC ... *H01L21/823828* (2013.01); *H01L 27/0924* (2013.01); *H01L 29/0649* (2013.01); *H01L 29/0673* (2013.01); *H01L 29/1083* (2013.01); *H01L 29/16* (2013.01); *H01L 29/161* (2013.01); *H01L 29/42392* (2013.01); *H01L 29/78696* (2013.01)

(56) References Cited

U.S. PATENT DOCUMENTS

| | | |
|---|---|---|
| 2007/0128786 A1 | 6/2007 | Cheng et al. |
| 2008/0017934 A1 | 1/2008 | Kim et al. |
| 2008/0135949 A1 | 6/2008 | Lo et al. |
| 2010/0295021 A1 | 11/2010 | Chang et al. |
| 2011/0133167 A1 | 6/2011 | Bangsaruntip et al. |
| 2011/0278676 A1* | 11/2011 | Cheng ............ H01L 21/823807 257/369 |
| 2012/0138886 A1 | 6/2012 | Kuhn et al. |
| 2013/0161639 A1 | 6/2013 | Pal et al. |
| 2013/0161756 A1 | 6/2013 | Glass et al. |
| 2013/0234215 A1* | 9/2013 | Okano ............. H01L 29/42392 257/255 |
| 2013/0270512 A1* | 10/2013 | Radosavljevic H01L 21/823807 257/9 |
| 2014/0051213 A1 | 2/2014 | Chang et al. |
| 2014/0091360 A1* | 4/2014 | Pillarisetty ......... H01L 21/8258 257/190 |
| 2014/0159114 A1 | 6/2014 | Zheng et al. |
| 2014/0197377 A1 | 7/2014 | Kim et al. |
| 2015/0035071 A1 | 2/2015 | Ching |

OTHER PUBLICATIONS

Notice of Allowance issued in Application No. 10-2014-0099166 dated Feb. 25, 2016.

* cited by examiner

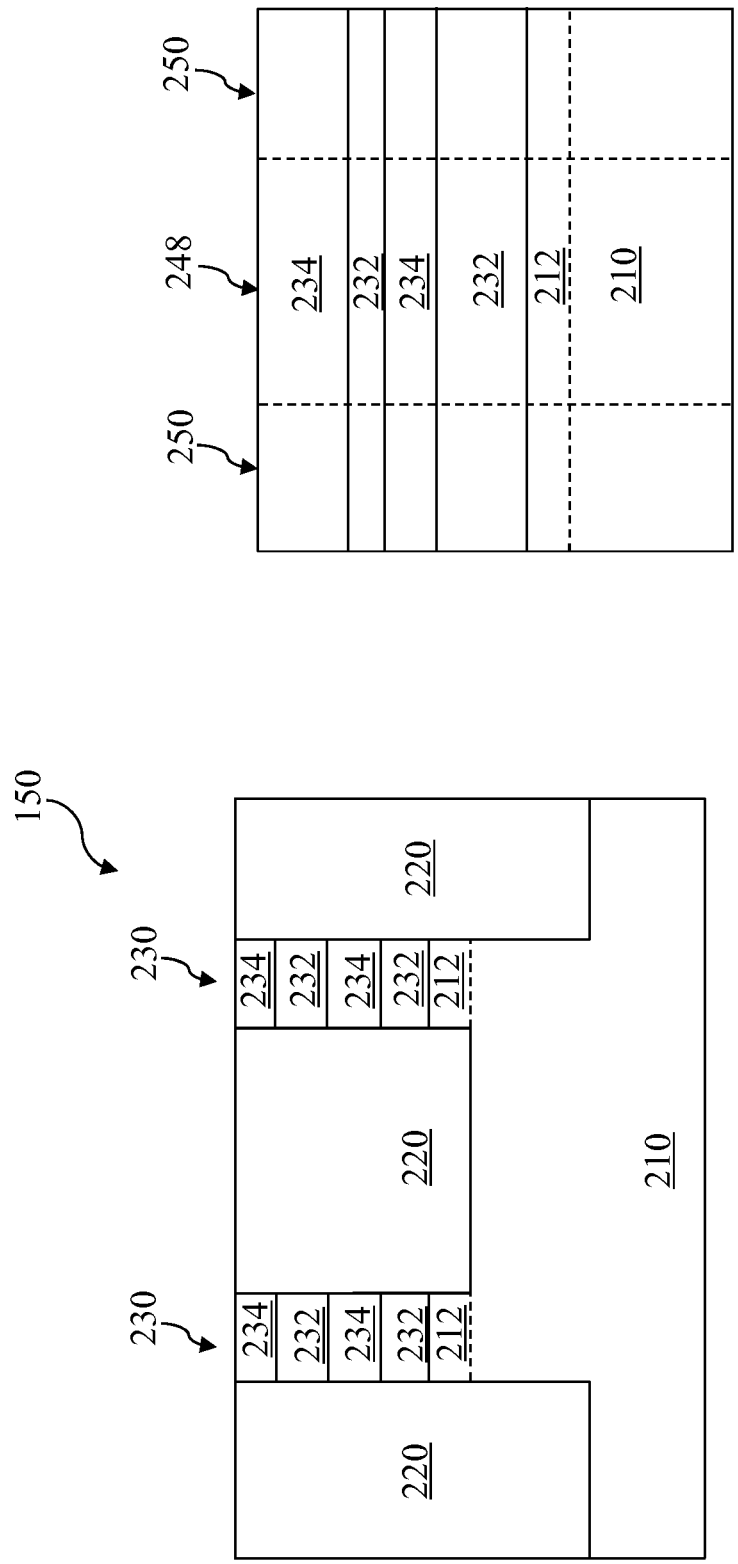

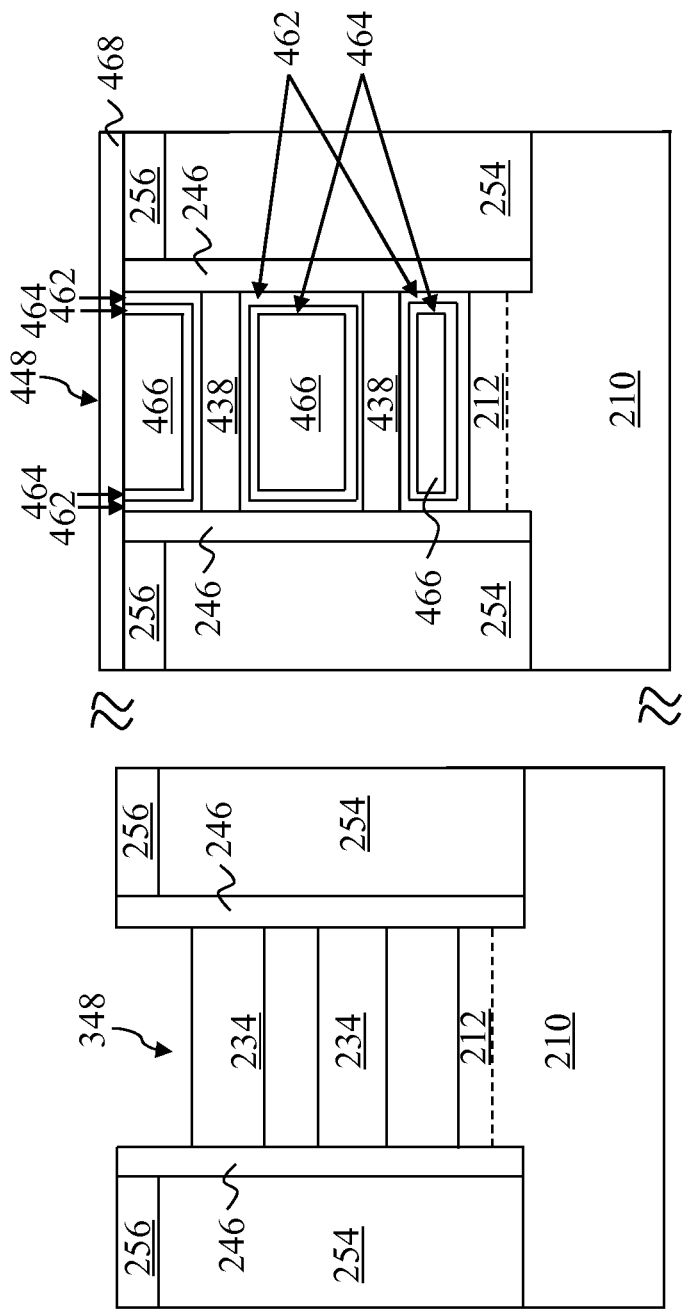

US 9,443,856 B2

SEMICONDUCTOR DEVICE AND FABRICATING THE SAME

PRIORITY DATA

The present application is a divisional application of U.S. patent application Ser. No. 13/957,500, filed Aug. 2, 2013, which is incorporated herein by reference in its entirety.

CROSS-REFERENCE

This application is related to U.S. Ser. No. 13/957,102 filed on Aug. 1, 2013, which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, has been introduced to replace a planar transistor. Although existing semiconductor devices and methods of fabricating semiconductor devices have been generally adequate for their intended purposes, they have not been entirely satisfactory in all respects. For example, to introduce three dimensional nanostructure to a gate channel raises challenges in a semiconductor device process development. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2B and 2C are cross-sectional views of the device precursor along the line A-A and line B-B in FIG. 2A respectively according to some embodiments of the present disclosure.

FIGS. 3B, and 4A-6A are cross-sectional views of the semiconductor device along the line A-A in FIG. 3A at various fabrication stages constructed according to the method of FIG. 1.

FIGS. 3C, and 4B-6B are cross-sectional views of the semiconductor device along the line B-B in FIG. 3A at various fabrication stages constructed according to the method of FIG. 1.

FIGS. 5C-6C are cross-sectional views of the semiconductor device along the line C-C in FIG. 3A at various fabrication stages constructed according to the method of FIG. 1.

FIGS. 7A-15A are cross-sectional views of the NMOS region and the PMOS region of the IC device along the line A-A in FIG. 3A at various fabrication stages constructed according to the method of FIG. 1.

FIGS. 7B-15B are cross-sectional views of the NMOS region and the PMOS region of the IC device along the line B-B in FIG. 3A at various fabrication stages constructed according to the method of FIG. 1.

DETAILED DESCRIPTION

Figure 1:
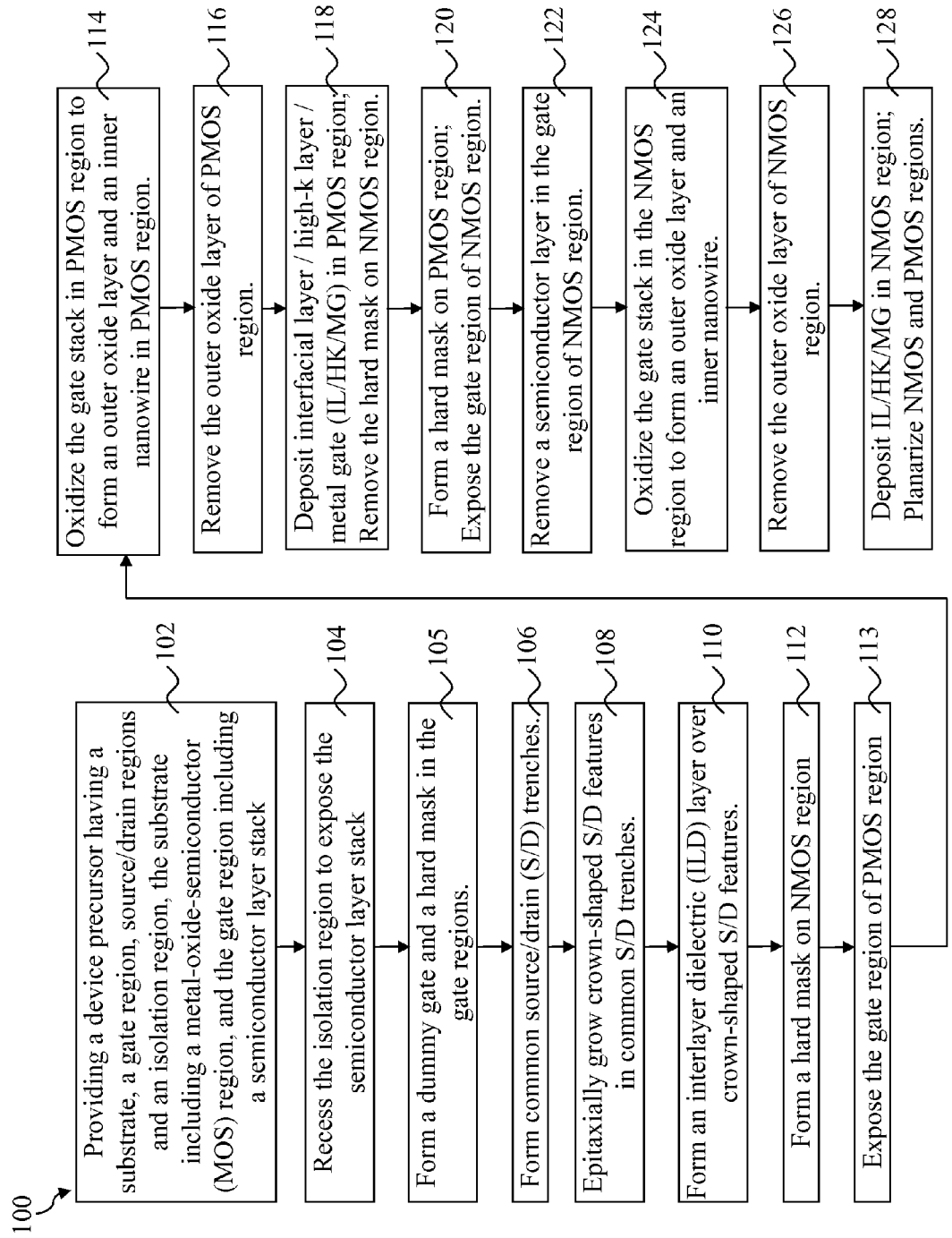
FIG. 1 is a flow chart of an example method for fabricating an N-type metal-oxide-semiconductor (NMOS) region and a P-type metal-oxide-semiconductor (PMOS) region in an integrated circuit (IC) device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a complementary metal-oxide-semiconductor (CMOS) device comprising a P-type metal-oxide-semiconductor (PMOS) device and an N-type metal-oxide-semiconductor (NMOS) device. The following disclosure will continue with a CMOS device example to illustrate various embodiments of the present invention. It is understood, however, that the present disclosure should not be limited to a particular type of device, except as specifically claimed. It is also understood that additional steps can be provided before, during, and after the method, and some of the steps described can be replaced or eliminated for other embodiments of the method.

Referring to FIGS. 1 and 2A-2C, the method 100 begins at step 102 by providing a device precursor 150. Device precursor 150 may be a precursor used to fabricate a metal-oxide-semiconductor (MOS) region, such as MOS region 200, 300 and/or 400 (as shown in FIGS. 3-15). Device precursor 150 includes a substrate 210. Substrate 210 may include bulk silicon. Alternatively, an elementary semiconductor, such as silicon or germanium in a crystalline structure, may also be included in substrate 210. Device precursor 150 may also include a compound semiconductor, such as silicon germanium, silicon carbide, gallium arsenic, gallium phosphide, indium phosphide, indium arsenide, and/or indium antimonide; or combinations thereof. Possible substrates 210 also include a semiconductor-on-insulator substrate, such as silicon-on-insulator (SOI), SiGe-On-Insulator (SGOI), Ge-On-Insulator substrates. For example, the SOI substrates may be fabricated using separation by implantation of oxygen (SIMOX), wafer bonding, and/or other suitable methods.

Various doped regions may also be included in substrate 210 depending on design requirements. The doped regions may be doped with p-type dopants, such as boron or $BF_2$. The doped regions may also be doped with n-type dopants, such as phosphorus or arsenic. The doped regions may also be doped with combinations of p-type and n-type dopants. The doped regions may be formed directly on substrate 210, in a P-well structure, in an N-well structure, in a dual-well structure, or using a raised structure.

An anti-punch through (APT) region 212 may be formed in the upper portion of substrate 210 and below semiconductor layer stack 230. APT region 212 may be formed to prevent device punch-through issue and provide better leakage control. In some examples, when the device precursor 150 is used to fabricate an NMOS unit, APT region 212 in substrate 210 may be doped with p-type dopants, such as boron and/or $BF_2$. In some examples, when the device precursor 150 is used to fabricate a PMOS unit, APT region 212 in substrate 210 may be doped with n-type dopants, such as phosphorus and/or arsenic.

Figure 2A:
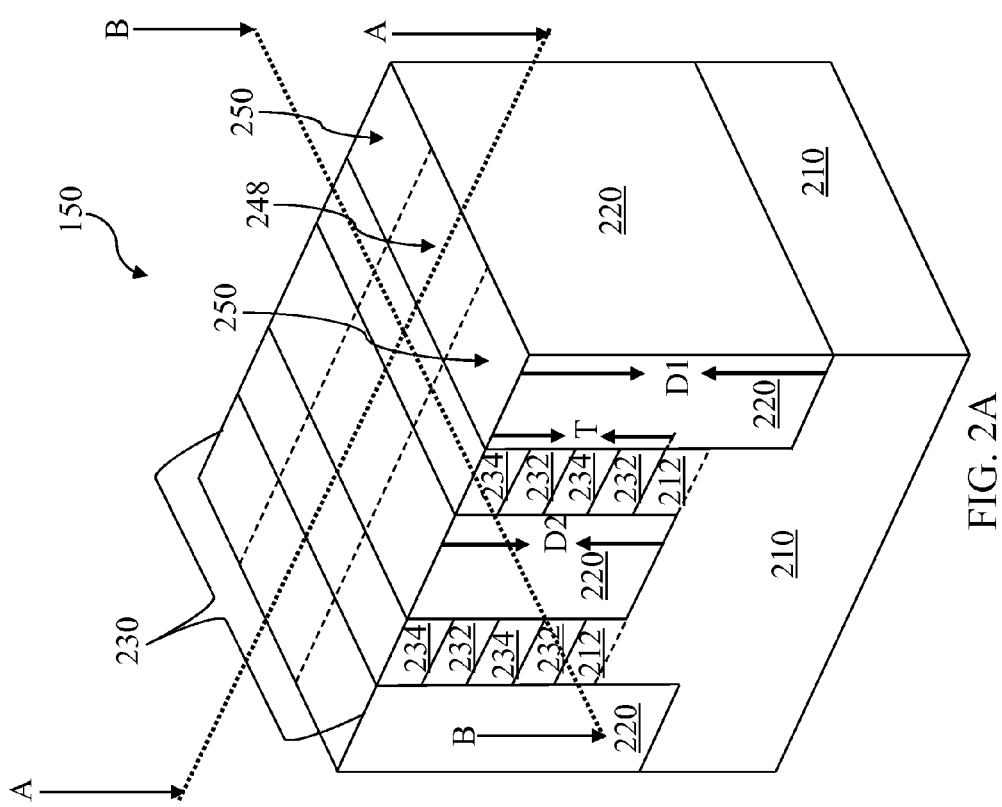
FIG. 2A is a diagrammatic perspective view of a device precursor according to some embodiments of the present disclosure.

Referring to FIGS. 2A-2C, device precursor 150 may also include one or more isolation regions 220. Isolation regions 220 are formed over substrate 210 to isolate active regions. For example, each isolation region 220 separates semiconductor layer stacks 230 from each other. Isolation regions 220 may be formed using traditional isolation technology, such as shallow trench isolation (STI), to define and electrically isolate the semiconductor layer stacks. In some examples, isolation regions 220 may include silicon oxide, silicon nitride, silicon oxynitride, an air gap, other suitable materials, or combinations thereof. Isolation regions 220 may be formed by any suitable process. In some examples, the formation of an STI includes a photolithography process, etching a trench in substrate 210 (for example, by using a dry etching and/or wet etching), and filling the trench (for example, by using a chemical vapor deposition process) with one or more dielectric materials to form isolation regions 220. In some examples, the filled trench may have a multi-layer structure such as a thermal oxide liner layer filled with silicon nitride or silicon oxide. In some embodiments, a chemical mechanical polishing (CMP) process is performed to remove excessive dielectric materials and planarize the top surface of the isolation regions.

As shown in FIG. 2A, the isolation region disposed at the side of the device precursor 150 is inter isolation region, and the isolation region disposed between the semiconductor layer stacks 230 is intra isolation region. In some embodiments, the depth of the inter isolation region (D1) is greater than the depth of the intra isolation region (D2). For example as shown in FIG. 2A, D1 may be in the range of 60-120 nm. D2 may be in the range of 40-60 nm.

Still referring to FIGS. 2A-2C, device precursor 150 includes one or more semiconductor layer stacks 230 formed over substrate 210. The formation process of semiconductor layer stacks 230 may include photolithography and etching processes. The photolithography process may include forming a photoresist layer (resist) overlying the substrate, exposing the resist to a pattern, performing a post-exposure bake process, and developing the resist to form a masking element including the resist. The etching process may include any appropriate dry etching and/or wet etching method. Semiconductor layer stacks 230 may be epitaxially grown after the recessing processes. In some embodiments, the thickness (T) of the recessed portions of substrate 210 may be in the range of 30-50 nm. Alternatively, semiconductor layer stacks 230 may be formed by patterning and etching a silicon layer deposited overlying an insulator layer (for example, an upper silicon layer of a silicon-insulator-silicon stack of an SOI substrate.

As shown in FIGS. 2A-2C, semiconductor layer stacks 230 may include multiple semiconductor layers. Each of the semiconductor layers may have substantial different thickness to each other. Semiconductor layer stacks 230 may include germanium (Ge), silicon (Si), gallium arsenide (GaAs), silicon germanium (SiGe), gallium arsenide phosphide (GaAsP), or other suitable materials. Semiconductor layer stacks 230 may be deposited by epitaxial growing processes, such as chemical vapor deposition (CVD), Vapor Phase Epitaxy (VPE), ultra high vacuum (UHV)-CVD, molecular beam epitaxy (MBE), and/or other suitable processes. The surface of device precursor 150 including the semiconductor layer stacks 230 may be then planarized using a CMP process.

Referring to FIG. 2B, semiconductor layer stacks 230 of device precursor 150 may include one or more first layers 232 and one or more second layers 234 alternatingly stacked over each other. In some embodiments, the first layers 232 may include SiGe. The second layers 234 may include Si. In some embodiments, semiconductor layer stacks 230 may include an alternating structure as SiGe (232)/Si (234)/SiGe (232)/Si (234) from bottom to top. In some embodiments, the first layers 232 may have a thickness in the range of 5-10 nm. The second layers 234 may have a thickness in the range of 5-15 nm. In some embodiments, the thicknesses of the first layers 232 may be different from each other. The thicknesses of the second layers 234 may be different from each other. In some embodiments, the percentage of Ge in the first layers SiGe 232 may be in the range of 20-50%. In some embodiments, the concentration of Ge in the first layers SiGe 232 may be different in some layers from others.

Referring to FIGS. 2A and 2C, substrate 210 includes a source/drain region 250 and a gate region 248. Source/drain regions 250 are separated by gate region 248.

Referring to FIGS. 1 and 3A-3C, method 100 proceeds to step 104 by recessing portions of isolation regions 220 to form recessing trenches 240 to laterally expose semiconductor layer stacks 230. The recessing process may include a dry etching process, a wet etching process, and/or combination thereof. The recessing process may include a selective wet etch or a selective dry etch. In some embodiments, the isolation regions 220 may be recessed until the entire semiconductor layer stack 230 can be exposed. It is noted that the following discussion will now refer to device precursor 150 as a MOS region 200.

Figure 4B:
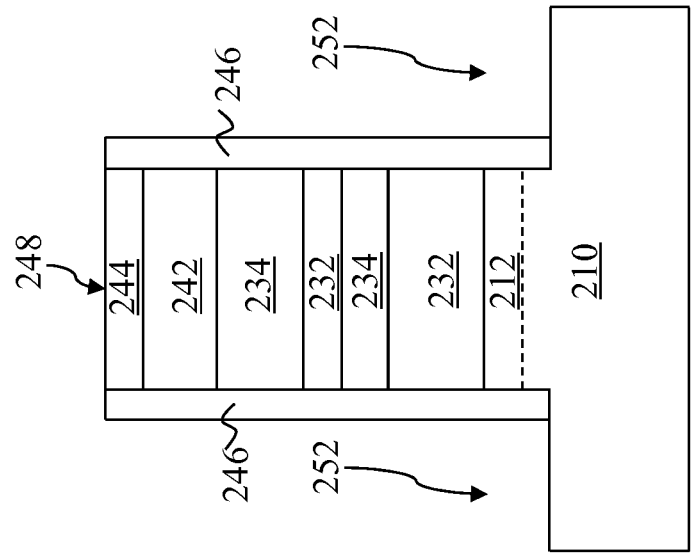
Figure 4A:
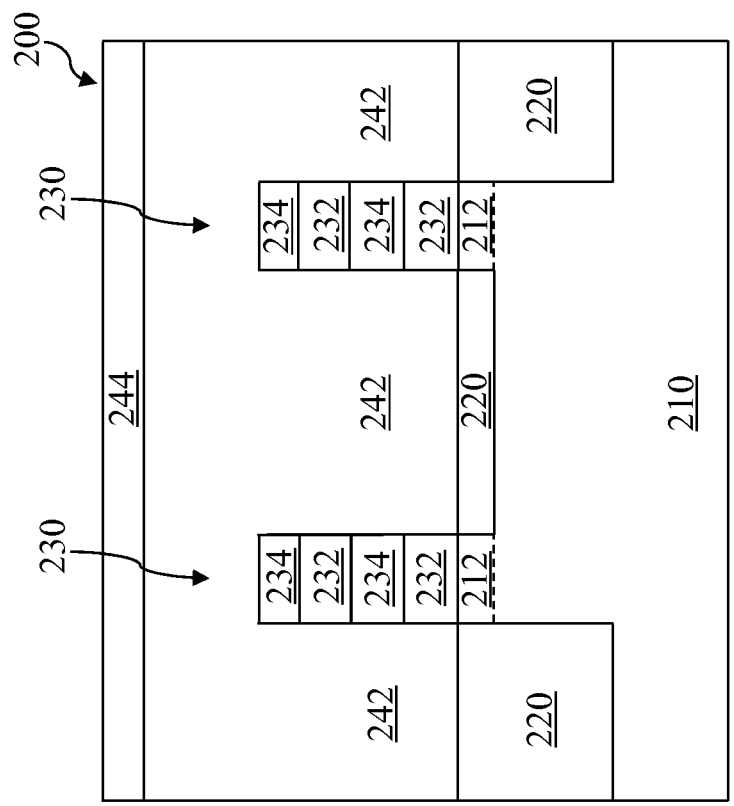
Figure 5B:
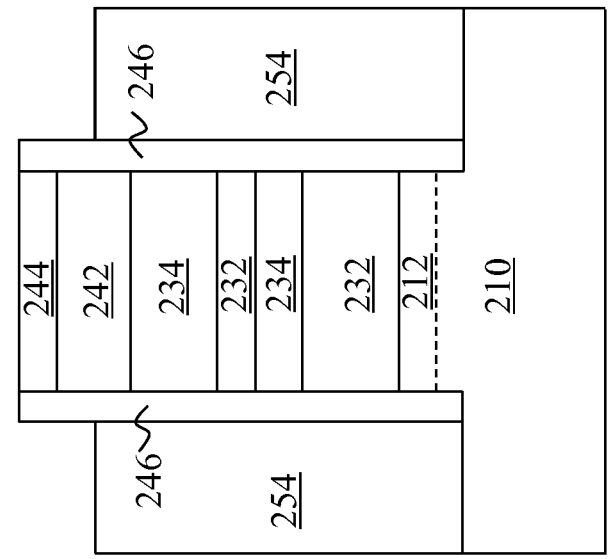
Figure 5A:
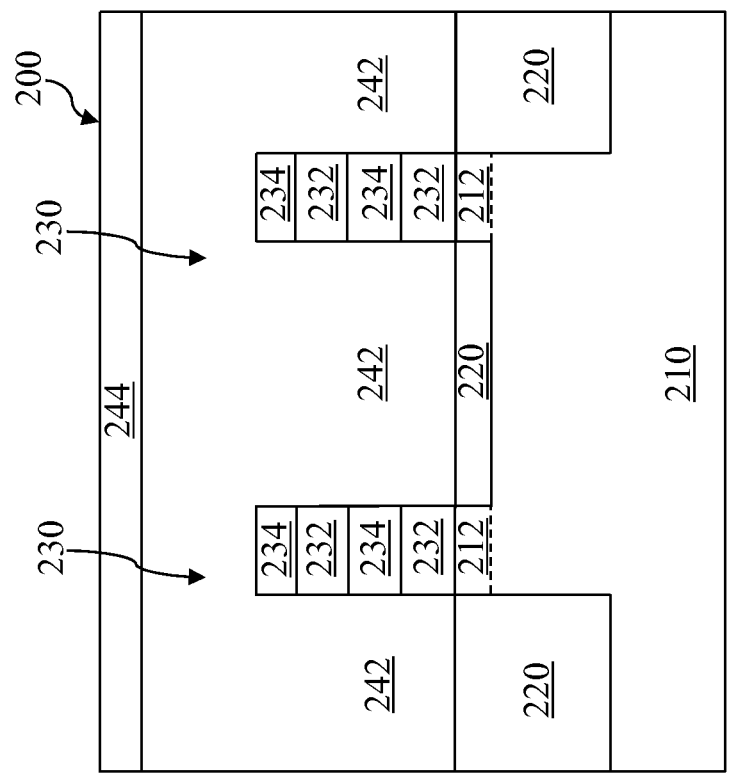

Referring to FIGS. 1 and 4A-4B, method 100 proceeds to step 105 by forming a dummy gate 242 and a hard mask 244 in gate region 248. Dummy gate 242 and hard mask 244 may be formed over the semiconductor layer stacks 230 and isolation regions 220 in gate region 248. Dummy gate 242 may include polysilicon. Dummy gate 242 may be formed by any suitable process or processes. For example, dummy gate 242 may be formed by a procedure including depositing, photolithography patterning, and/or etching processes. The deposition processes include CVD, PVD, ALD, other suitable methods, and/or combinations thereof. Hard mask 244 may include silicon oxide, silicon nitride, silicon oxynitride, or any other suitable dielectric material. Hard mask 244 may be a single layer or multiple layers. Hard mask 244 may be formed by CVD, ALD, or any other appropriate method.

Figure 3A:
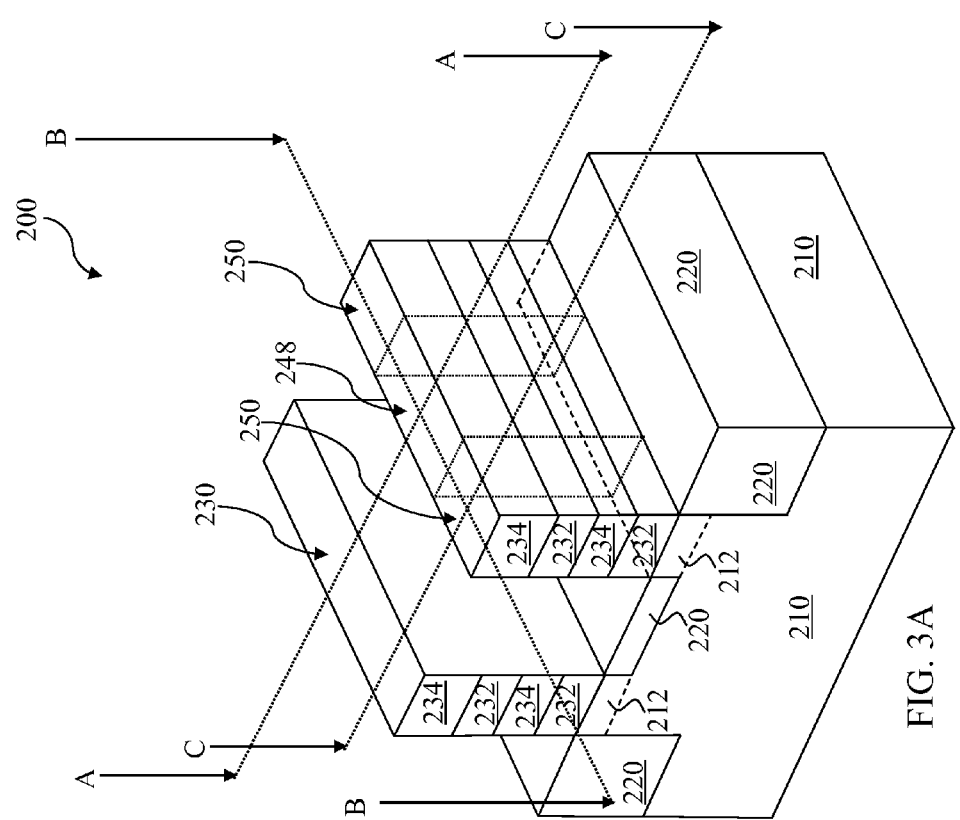
FIG. 3A is a diagrammatic perspective view of a metal-oxide-semiconductor (MOS) region in the IC device at an intermediate stage constructed according to the method of FIG. 1.
Figure 3C:
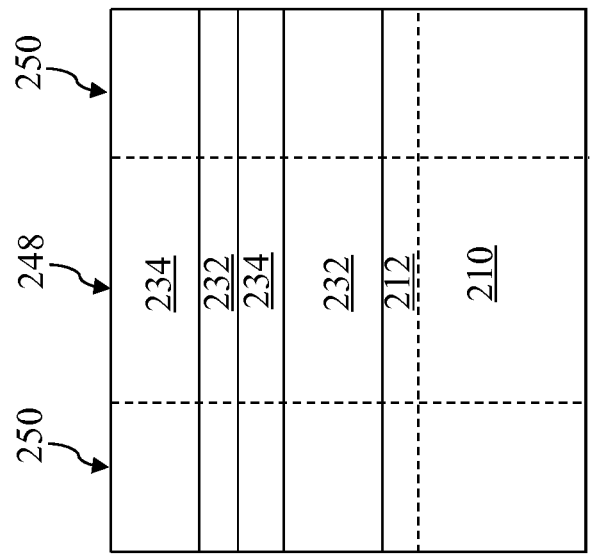
Figure 3B:
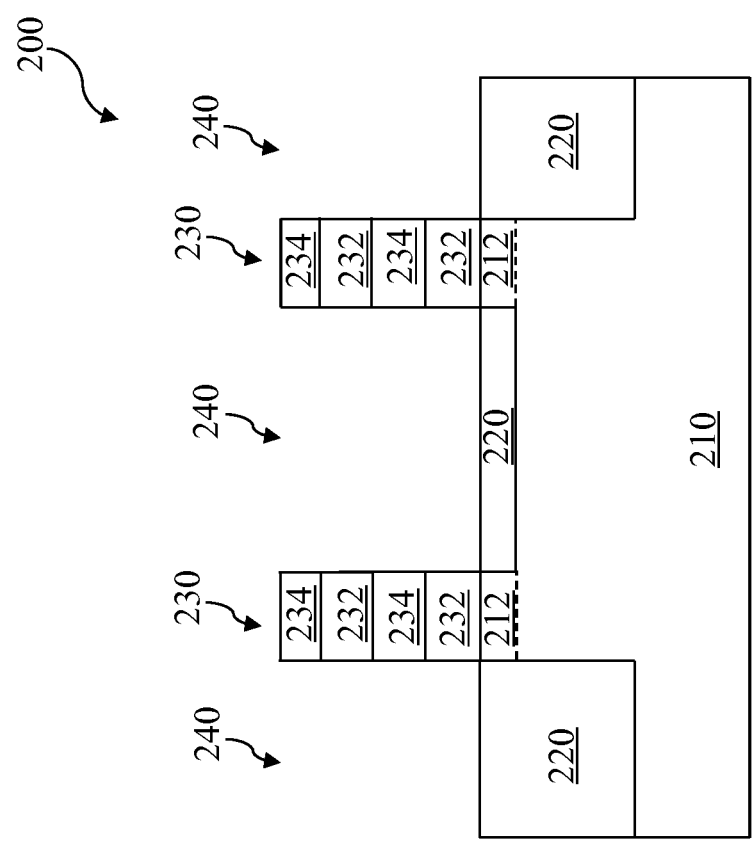

Referring to FIGS. 1 and 4B, method 100 proceeds to step 106 by forming common source/drain recessing trenches 252 in MOS region 200. Referring to FIGS. 3A and 4B, portions of the semiconductor layer stack 230, isolation regions 220, and/or substrate 210 in the source/drain regions 250 may be removed along the line C-C direction to form common source/drain trenches 252 in MOS region 200 using dummy gate 242 and hard mask 244. Common Source/drain recessing trenches 252 may be formed using any kind of dry etching process, wet etching process, and/or appropriate combination thereof. The recessing process may also include a selective wet etch or a selective dry etch. The recessing process may include multiple etching processes.

Still referring to FIG. 4B, sidewall spacers 246 may be formed along gate region 248 after dummy gate 242 and hard mask 244 are formed. Sidewall spacers 246 may include a dielectric material such as silicon oxide, silicon nitride, silicon carbide, silicon oxynitride, or combinations thereof. Sidewall spacers 246 may also include multiple layers. Typical formation methods for the sidewall spacers include depositing a dielectric material over gate region 248. The dielectric material may be then anisotropically etched back. The etching back process may include a multiple-step etching to gain etch selectivity, flexibility and desired over-etch control.

Referring to FIGS. 1 and 5A-5C, method 100 proceeds to step 108 by forming crown-shaped source/drain features 254 in common source/drain recessing trenches 252. A semiconductor material epitaxially grows in the common source/drain trenches 252 to form the crown-shaped source/drain features 254. The semiconductor material includes Ge, Si, GaAs, AlGaAs, SiGe, GaAsP, or other suitable material. Crown-shaped source/drain features 254 may be formed by one or more epitaxy or epitaxial (epi) processes. Crown-shaped source/drain features 254 may be in-situ doped during the epi process. For example, the epitaxially grown SiGe source/drain features 254 may be doped with boron; and the epitaxially grown Si epi source/drain features 254 may be doped with carbon to form Si:C source/drain features, phosphorous to form Si:P source/drain features, or both carbon and phosphorous to form SiCP source/drain features. In some embodiments, an implantation process (i.e., a junction implant process) is performed to dope crown-shaped source/drain features 254. One or more annealing processes may be performed to activate source/drain epitaxial feature. In some embodiments, a crown-shaped source/drain feature is a crown-shaped source region, and the other crown-shaped source/drain feature is a crown-shaped drain region. A crown-shaped source feature is separated by gate region 248 from a crown-shaped drain feature.

Although only common source/drain trenches 252 and crown-shaped source/drain features 254 are illustrated in the present disclosure, the source/drain trench 252 may be formed in an individual type separated by isolation regions 220, referred to as an individual source/drain trenches 252. Individual source/drain features 254 may be formed by epitaxially growing the semiconductor material in the individual source/drain trenches 252.

Figure 6A:
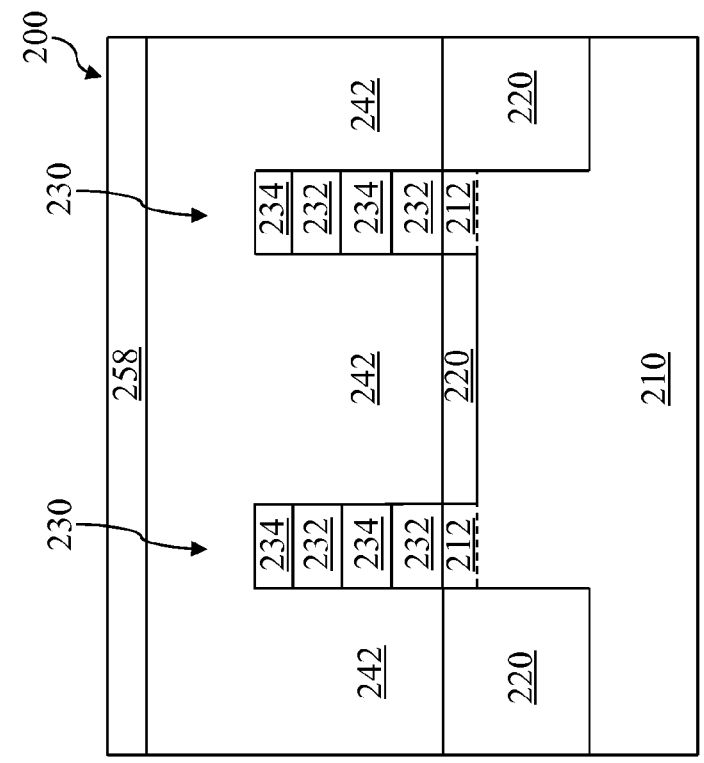
Figure 5C:
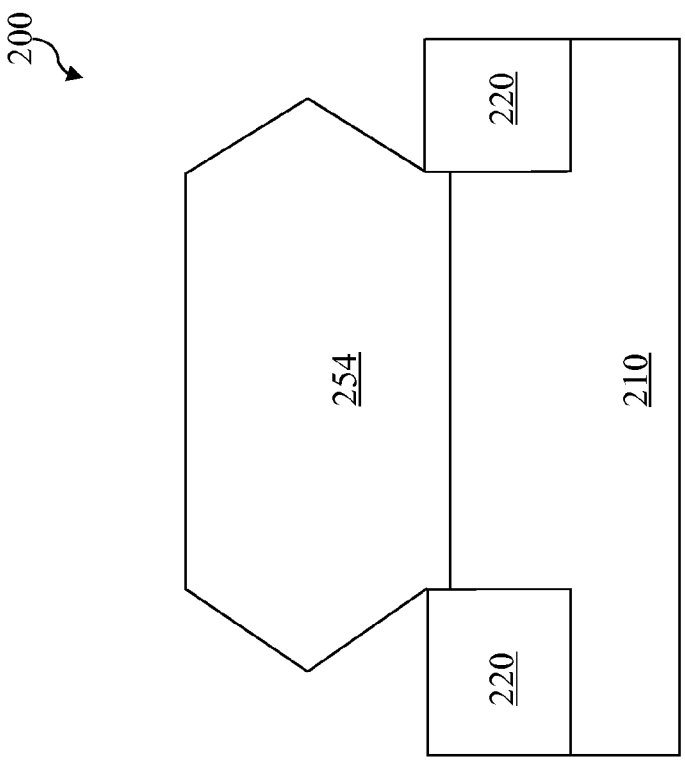
Figure 6C:
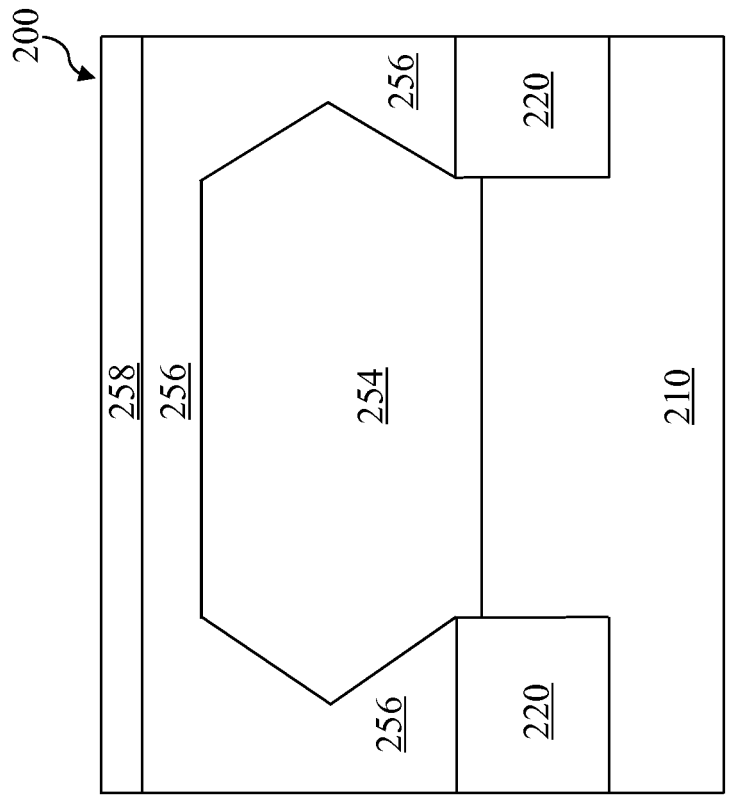
Figure 6B:
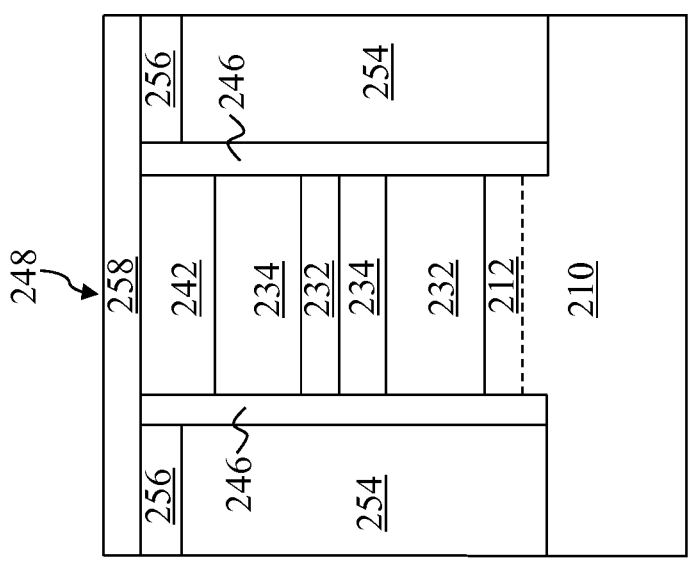

Referring to FIGS. 1 and 6A-6C, method 100 proceeds to step 110 by forming an interlayer dielectric (ILD) layer 256 over crown-shaped source/drain features 254. ILD layer 256 may include silicon oxide, oxynitride or other suitable materials. ILD layer 256 may include a single layer or multiple layers. ILD layer 256 may be formed by a suitable technique, such as CVD, ALD and spin-on technique. After forming ILD layer 256, CMP processes may be performed to remove excessive ILD layer 256 and planarize the top surface of ILD layer 256. In some embodiments, hard mask 244 may also be removed during the CMP processes as shown in FIGS. 6A-6C.

Referring to FIGS. 1 and 6A-6C, method 100 proceeds to step 112 by forming a patterned hard mask 258 to cover MOS region 200. After removing excessive ILD layers 256 and planarizing the surface of MOS region 200 at step 110, the surface of the MOS region 200 may be covered with a patterned hard mask 258 to prevent MOS region 200 from being affected during the processes carried out in other regions simultaneously. Hard mask 258 may include silicon oxide, silicon nitride, silicon oxynitride, or any other suitable dielectric material. Hard mask 258 may include a single layer or multiple layers. Hard mask 258 may be formed by CVD, ALD, or any other appropriate method.

Referring to FIGS. 7-15, more than one MOS region 200 may be used to form different types of MOS regions in an IC device 500 simultaneously or separately. In some examples as illustrated in the present disclosure, an NMOS region 300 and PMOS region 400 may be formed in IC device 500 using method 100 as shown in FIG. 1. Alternatively, MOS region 300 may be a PMOS region 300, and MOS region 400 may be an NMOS region 400.

Figure 7A:
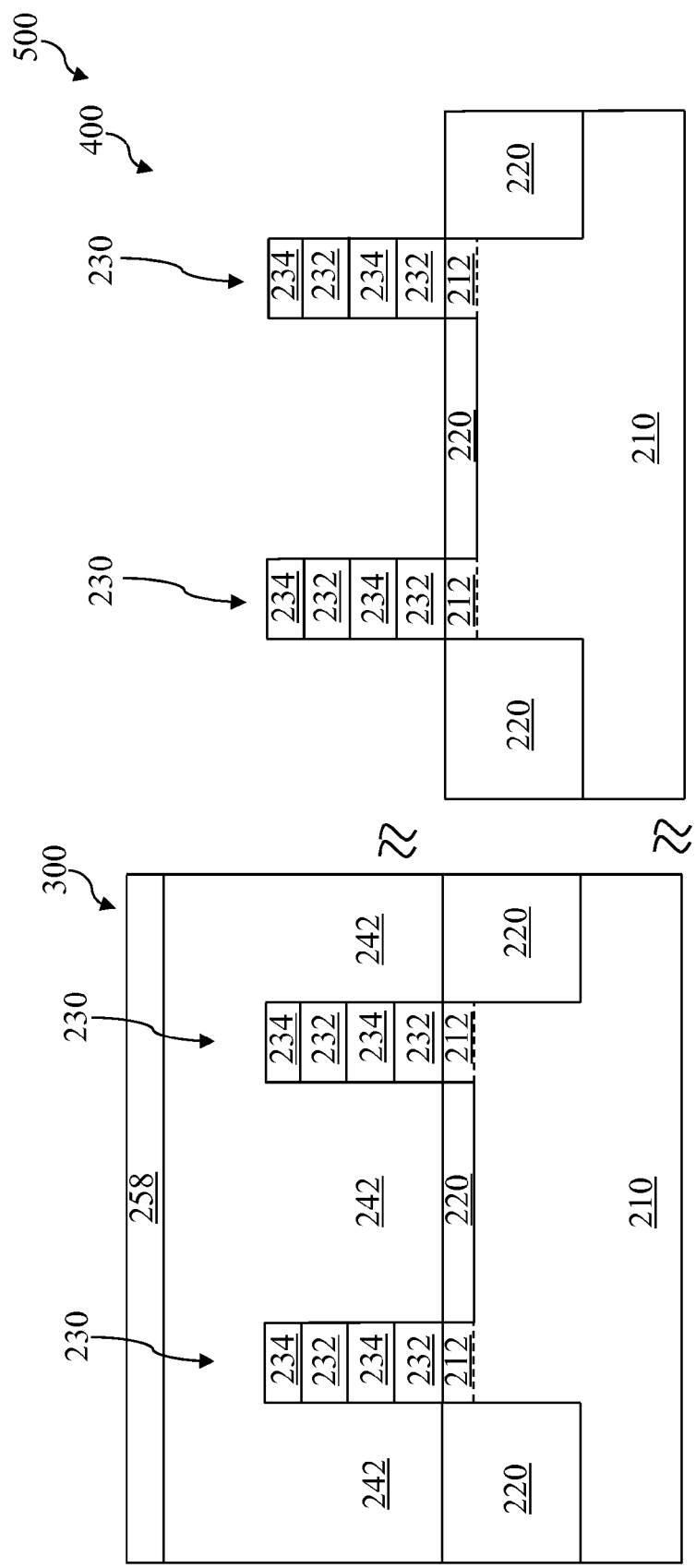
Figure 7B:
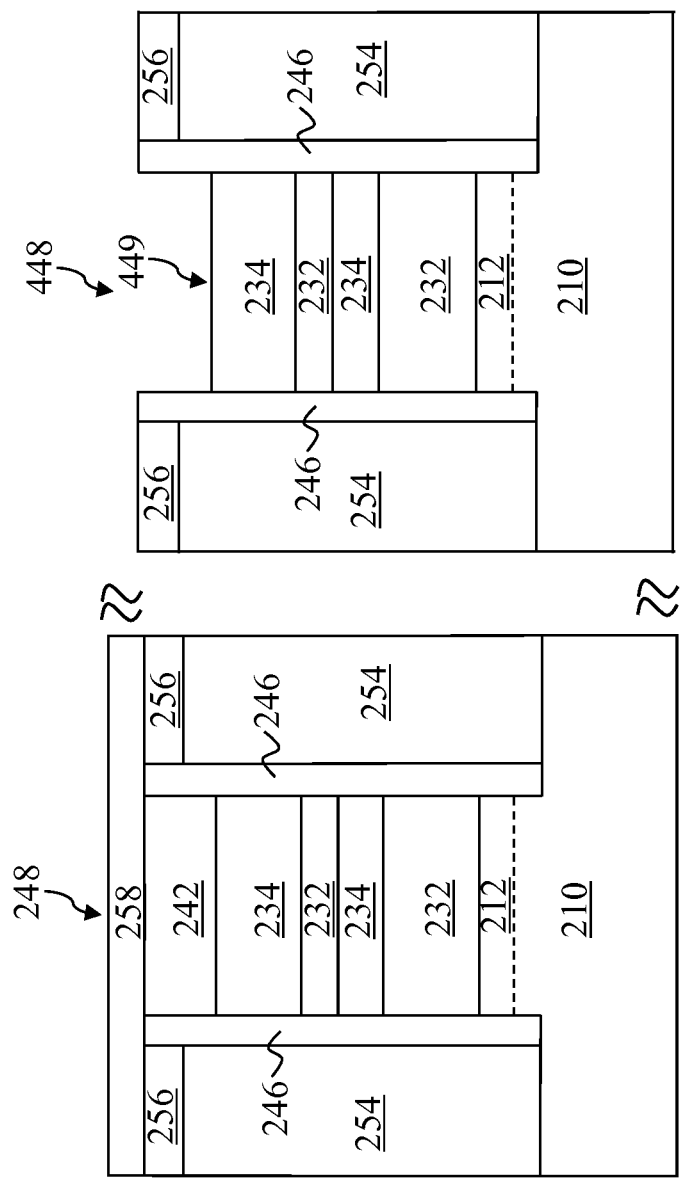

Referring to FIGS. 1 and 7A-7B, method 100 proceeds to step 113 by removing dummy gate 242 to expose semiconductor layer stacks 230 in gate region 248. In PMOS regions 400, gate region 248 is referred to as gate region 448. Dummy gate 242 of PMOS region 400 may be removed to expose a gate stack 449 as shown in FIG. 7B. Gate stack 449 may include semiconductor layer stack 230 disposed in gate region 448. Dummy gate 242 may be removed using any appropriate method, such as etching processes. The etching processes may include selective wet etch or selective dry etch, such that dummy gate 242 has an adequate etch selectivity with respect to gate stack 449, and the sidewall spacers 246. Alternatively, dummy gate 242 may be recessed by a series of processes including photolithography patterning and etching back.

Figure 8A:
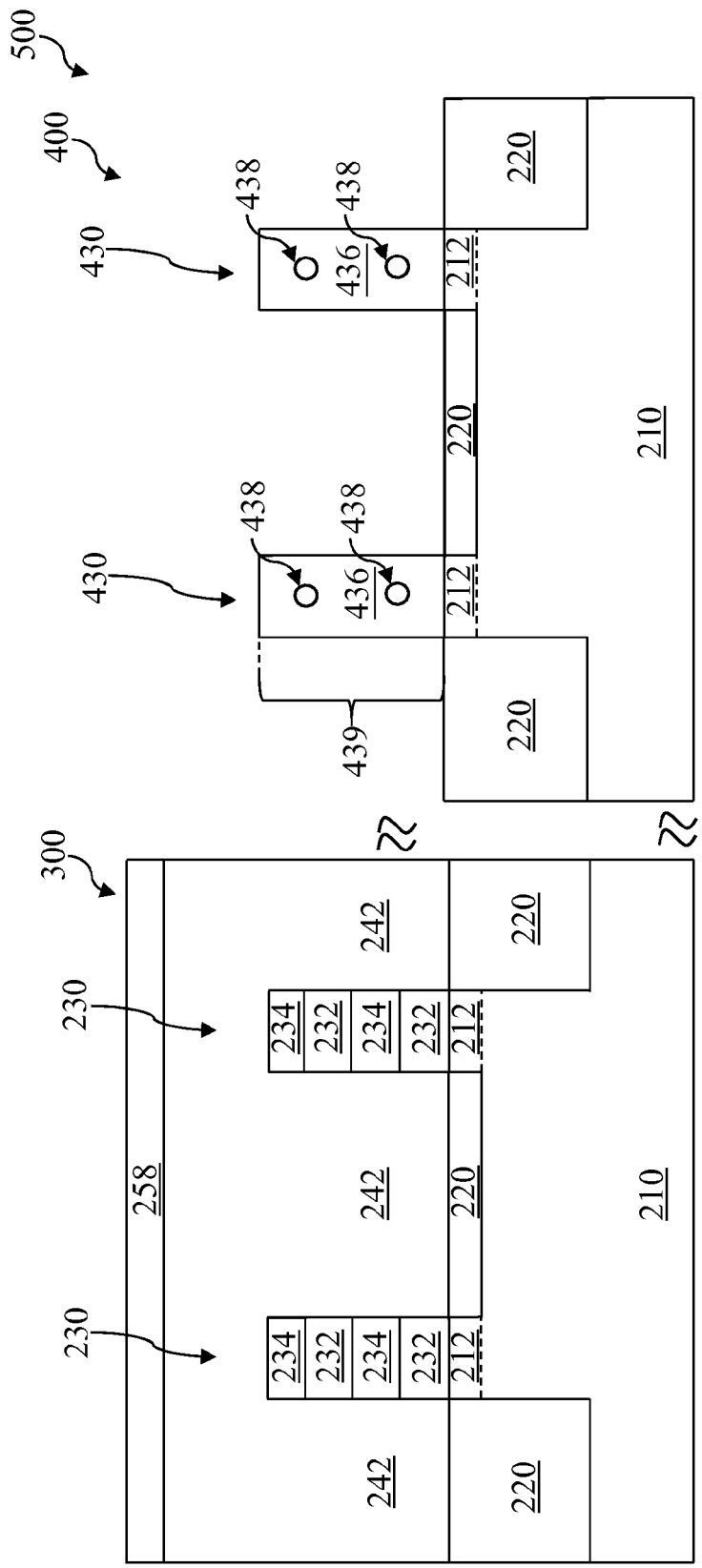
Figure 8B:
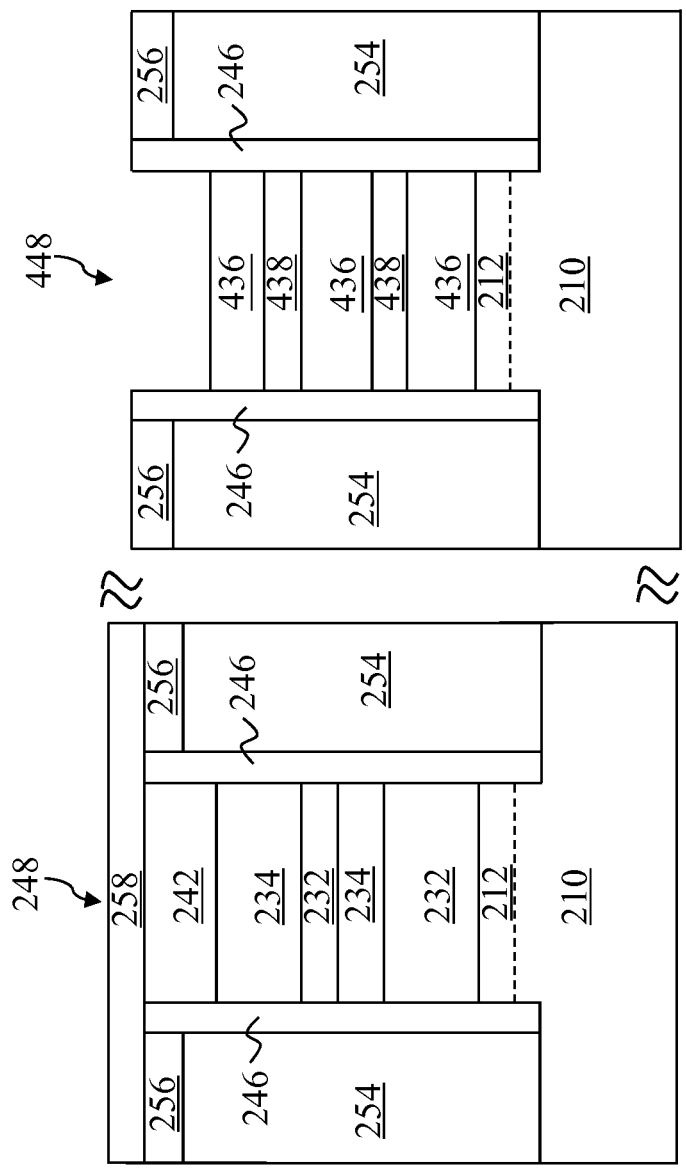

Referring to FIGS. 1 and 8A-8B, method 100 proceeds to step 114 by oxidizing portions of the gate stack 449 in gate region 448 of PMOS region 400 to form an outer oxide layer 436 and an inner nanowire 438. In some embodiments, a thermal oxidation process may be performed on the first layers 232 and the second layers 234 of gate stack 449. In some examples, the thermal oxidation process is conducted in oxygen ambient. In some examples, the thermal oxidation process may be conducted in a combination of steam ambient and oxygen ambient. The thermal oxidation process may be conducted in a combination of steam ambient and oxygen ambient with one atmospheric pressure and a temperature in a range from 400° C. to 600° C. The thermal oxidation process may be conducted for 30-180 minutes.

During the thermal oxidation process, an element of the first layers 232 and the second layers 234 are oxidized to form an outer oxide layer 436. In some embodiments, outer oxide layer 436 may include silicon oxide (SiOx), where x is oxygen composition in atomic percent. In some embodiments, another element of the first layers 232 may diffuse to the inside of outer oxide layer 436 to form a semiconductor core portion 438 during the oxidation process. Semiconductor core portion 438 may be formed continuously along the line B-B direction (as shown in FIG. 3A), and connected to the crown-shaped source/drain features 254 on both sides of gate region 448. It is noted that the following discussion will now refer to semiconductor core portion 438 as an inner semiconductor nanowire 438. In some embodiments, the inner semiconductor nanowire 438 may be Ge nanowire 438. The outer oxide layer 436 may be formed to wrap the inner semiconductor nanowire 438. In some embodiments, more than one inner semiconductor nanowire 438 may be formed in a nanowire set 439 in outer oxide layer 436.

Referring to FIGS. 8A-8B, in some examples, the diameter of the inner semiconductor nanowire 438 may be in the range of 2-15 nm. The size and shape of outer oxide layer 436 and/or inner semiconductor nanowire 438 may vary with different process conditions, such as thermal oxidation temperature and time.

Figure 9A:
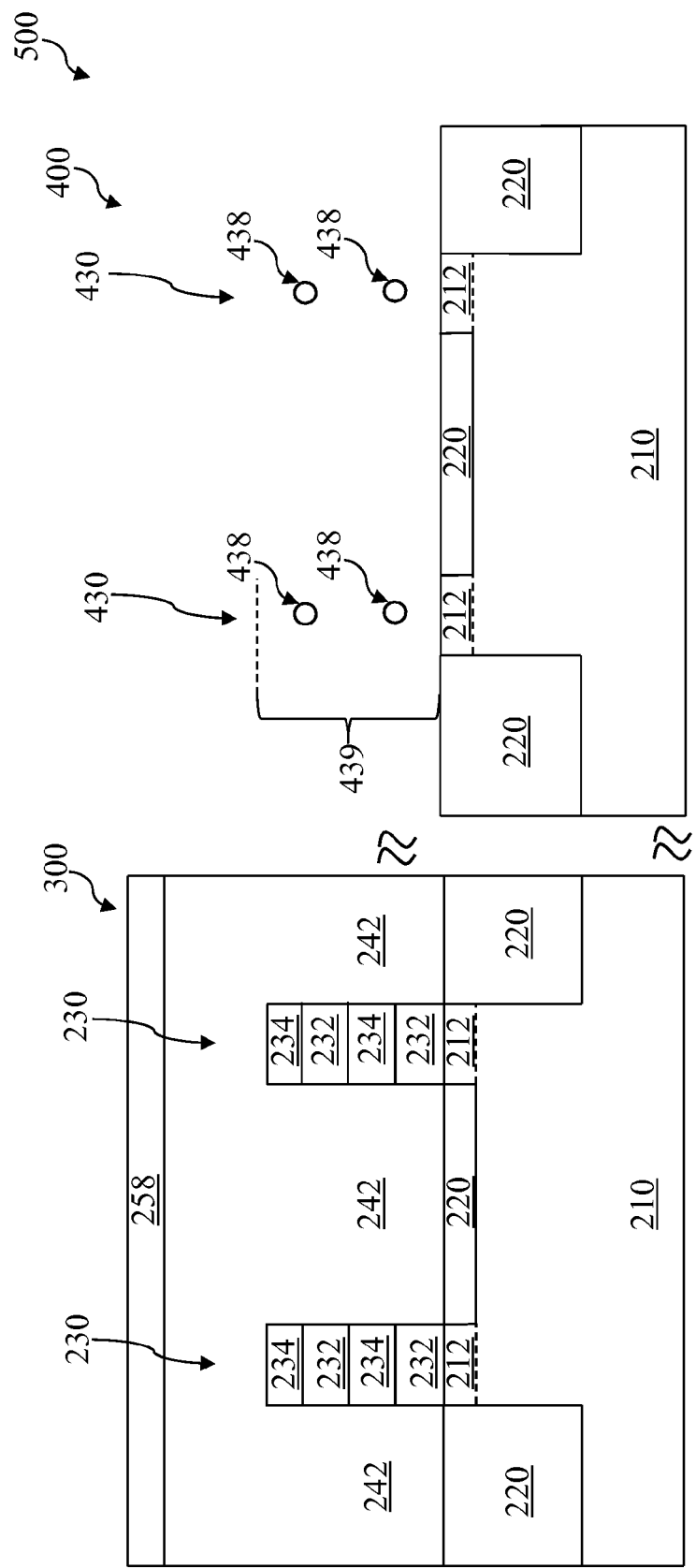
Figure 9B:
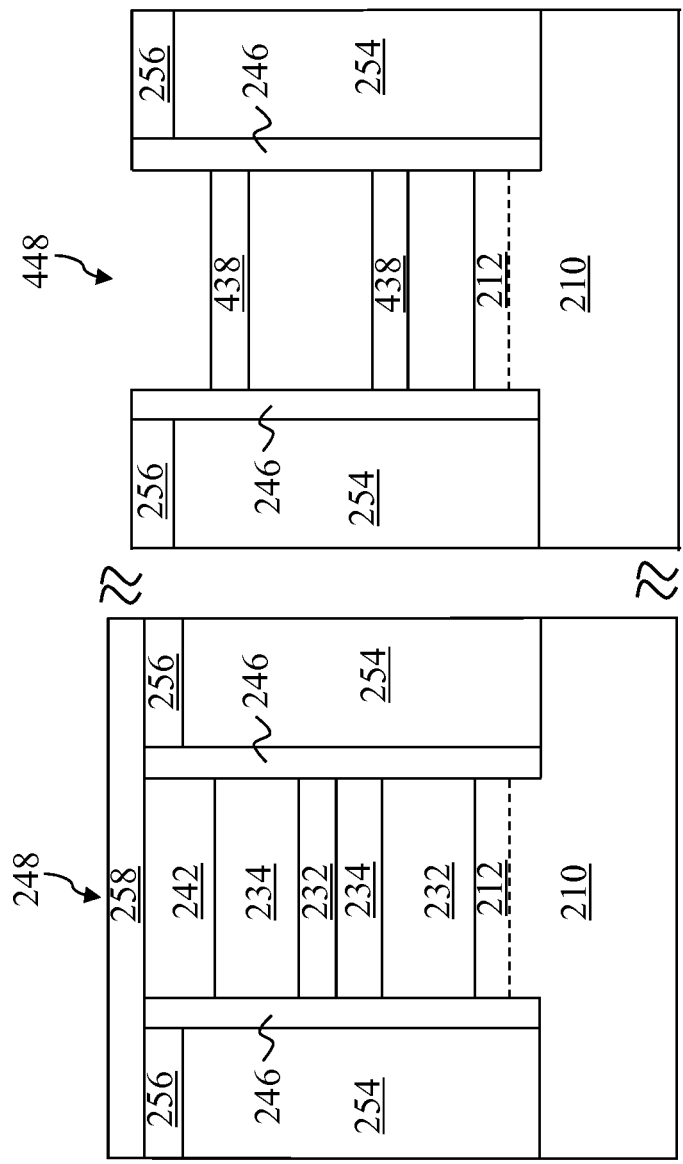

Referring to FIGS. 1 and 9A-9B, method 100 proceeds to step 116 by removing outer oxide layer 436 to expose one or more inner semiconductor nanowires 438 in PMOS region 400. The removing process may include a dry etch, a wet etch, or a combination of. For example, a selective wet etch or a selective dry etch of outer oxide layer 436 is performed with adequate etch selectivity with respect to inner semiconductor nanowire 438. After removing outer oxide layer 436, gate region 448 of the PMOS region 400 is configured to include one or more inner semiconductor nanowires 438 formed in nanowire set 439.

Figure 10A:
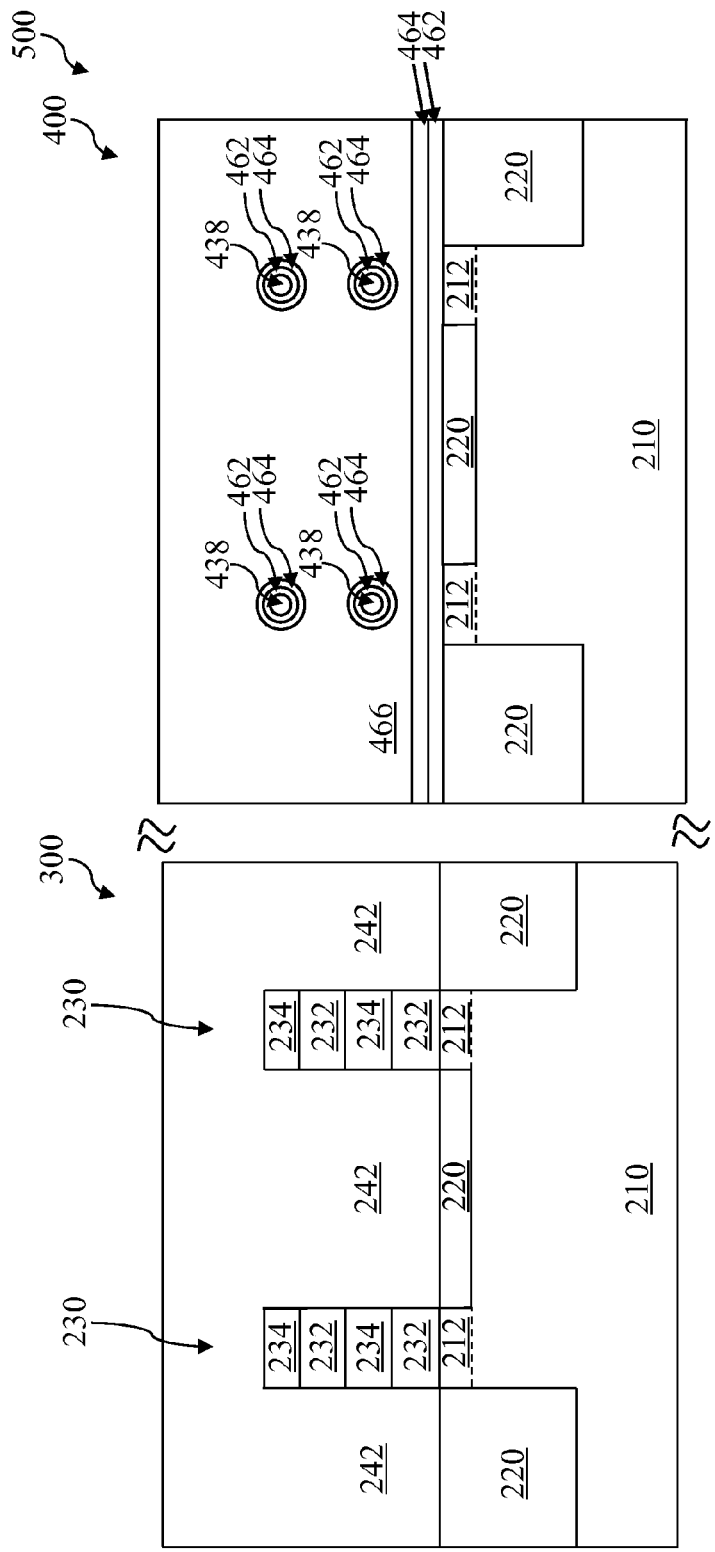
Figure 10B:
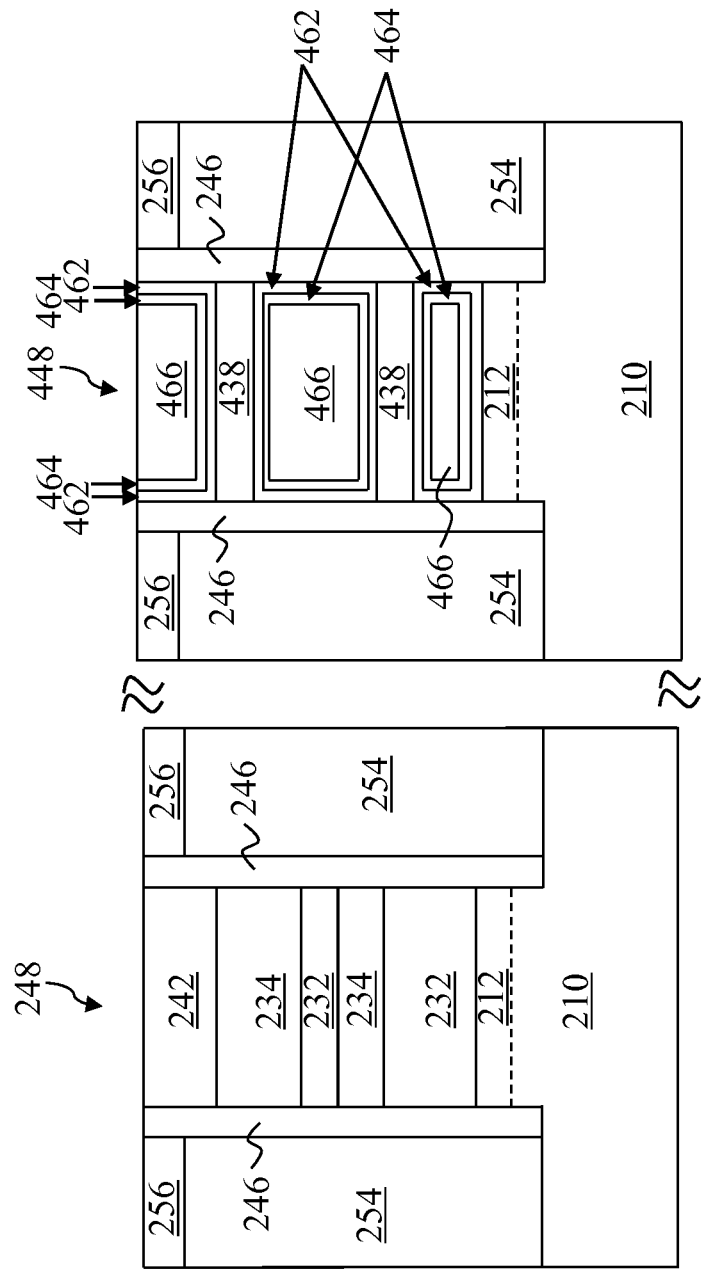

Referring to FIGS. 1 and 10A-10B, method 100 proceeds to step 118 by forming interfacial layer (IL) 462/high-k (HK) dielectric layer 464/metal gate (MG) 466 in PMOS region 400. In some embodiments, one or more ILs 462 may be formed to wrap around one or more inner nanowires 438, and cover sidewall spacers 246. IL 462 may be deposited by any appropriate method, such as ALD, chemical vapor deposition CVD and ozone oxidation. IL 462 may include oxide, HfSiO and oxynitride. In some embodiments, the interface between the isolation region 220 and the IL 462 may not be observed after the thermal treatment. One or more HK dielectric layers 464 may be deposited over and wrapping around ILs 462 by any suitable techniques, such as ALD, CVD, metal-organic CVD (MOCVD), physical vapor deposition (PVD), thermal oxidation, combinations thereof, or other suitable techniques. HK dielectric layer 464 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. IL 462 may include oxide, HfSiO and oxynitride. In some embodiments, the interface between the IL 462 and the HK dielectric layer 464 may not be observed after the thermal treatment.

An MG layer 466 may include a single layer or multi layers, such as metal layer, liner layer, wetting layer, and adhesion layer. MG layer 466 may include Ti, Ag, Al, TiAlN, TaC, TaCN, TaSiN, Mn, Zr, TiN, TaN, Ru, Mo, Al, WN, Cu, W, or any suitable materials. MG layer 466 may be formed by ALD, PVD, CVD, or other suitable process. A CMP process may be performed to remove excessive MG layer 466. The CMP process provides a substantially planar top surface for gate region 448 as well as ILD layers 256 in PMOS region 400. After depositing IL 462/HK layer 464/MG 466, gate region 448 may include one or more semiconductor nanowires 438, and IL 462/HK layer 464/MG 466 as shown in FIG. 10B.

Referring to FIGS. 10A-10B, in some embodiments at step 118, hard mask 258 over NMOS region 300 may be removed during the planarization of the surface of PMOS region 400 using a CMP process.

Figure 11A:
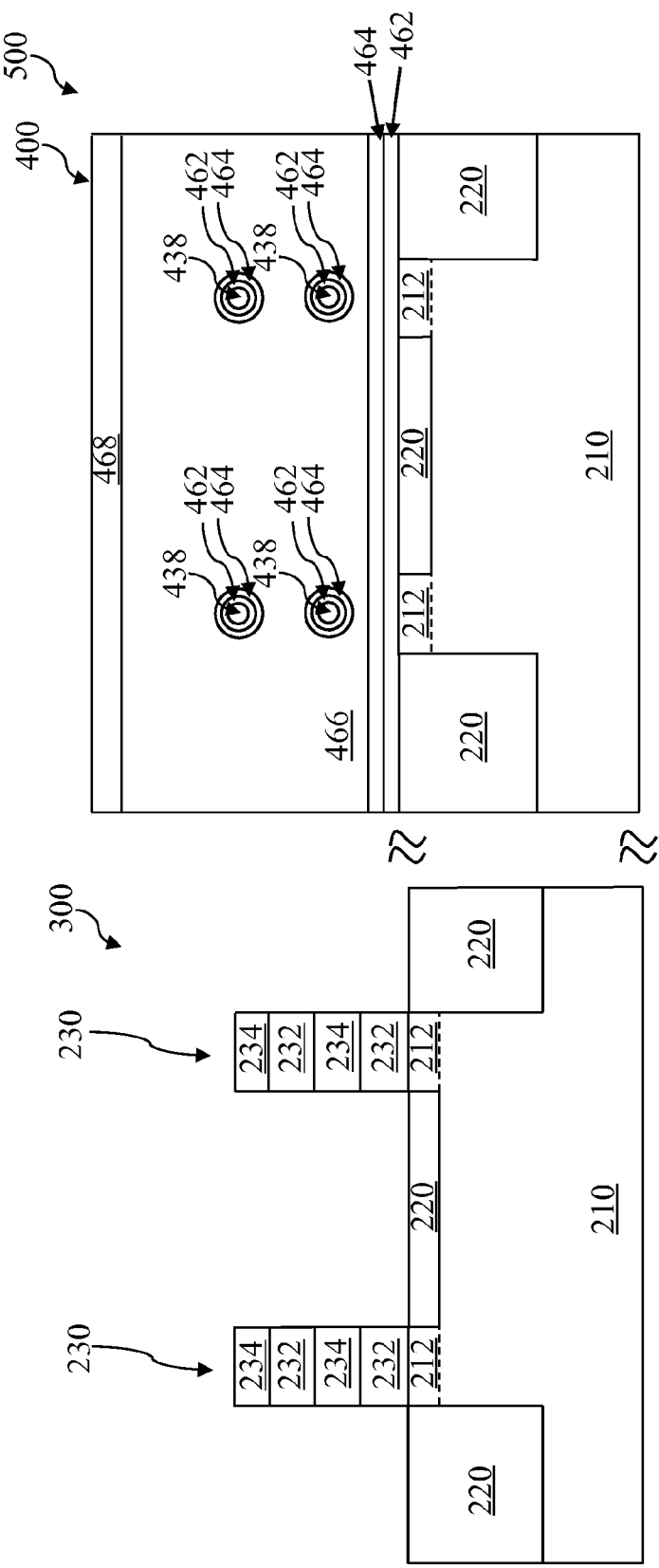
Figure 11B:
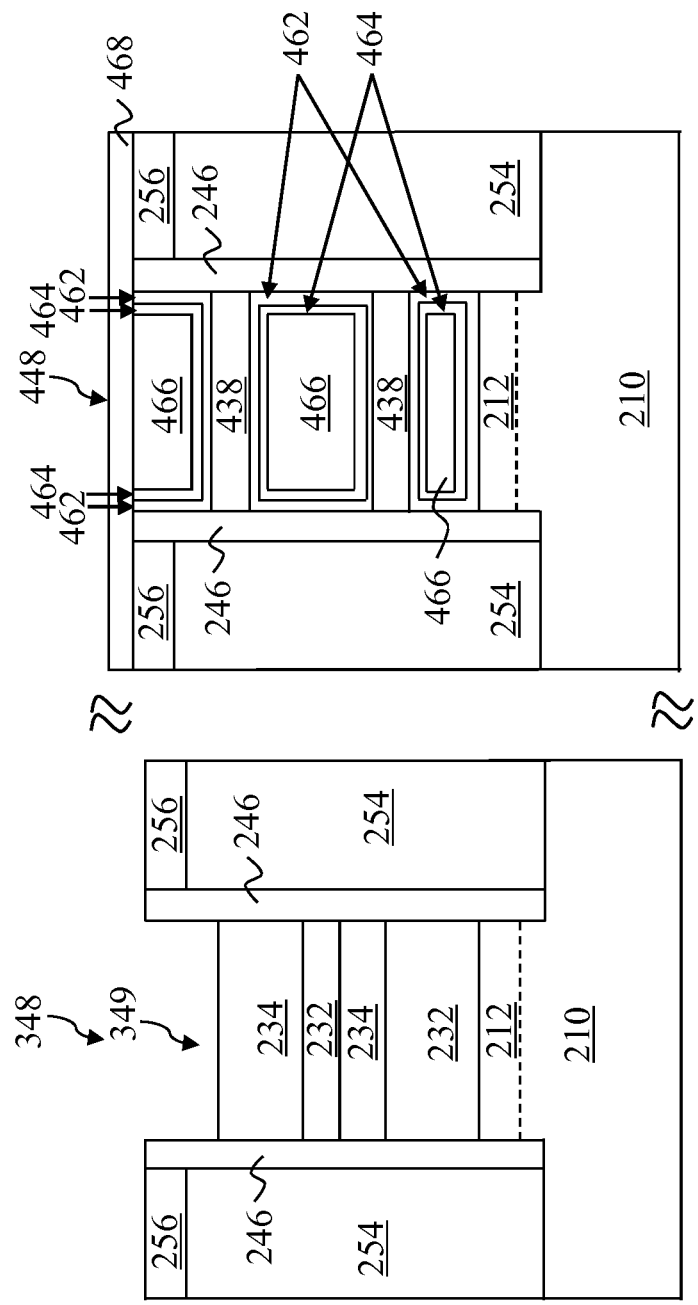

Referring to FIGS. 1 and 11A-11B, method 100 proceeds to step 120 by forming a hard mask 468 over PMOS region 400 to prevent PMOS region 400 from being affected during the following processes of NMOS region 300. Hard mask 468 may include silicon oxide, silicon nitride, silicon oxynitride, or any other suitable dielectric material. Hard mask 468 may include a single layer or multiple layers. Hard mask 468 may be formed by CVD, PVD, ALD, or any other appropriate method.

Still referring to FIGS. 11A-11B, in some embodiments at step 120, dummy gate 242 may be removed to expose gate stack 349 in gate region 348 of NMOS region 300. Gate stack 349 may include semiconductor layer stack 230 disposed in gate region 348 of NMOS region 300. Dummy gate 242 may be removed using any appropriate method, such as etching processes. The etching processes may include selective wet etch or selective dry etch, such that dummy gate 242 has an adequate etch selectivity with respect to gate stack 349, and the sidewall spacers 246. Alternatively, dummy gate 242 may be recessed by a series of processes including photolithography patterning and etching back.

Figure 12A:
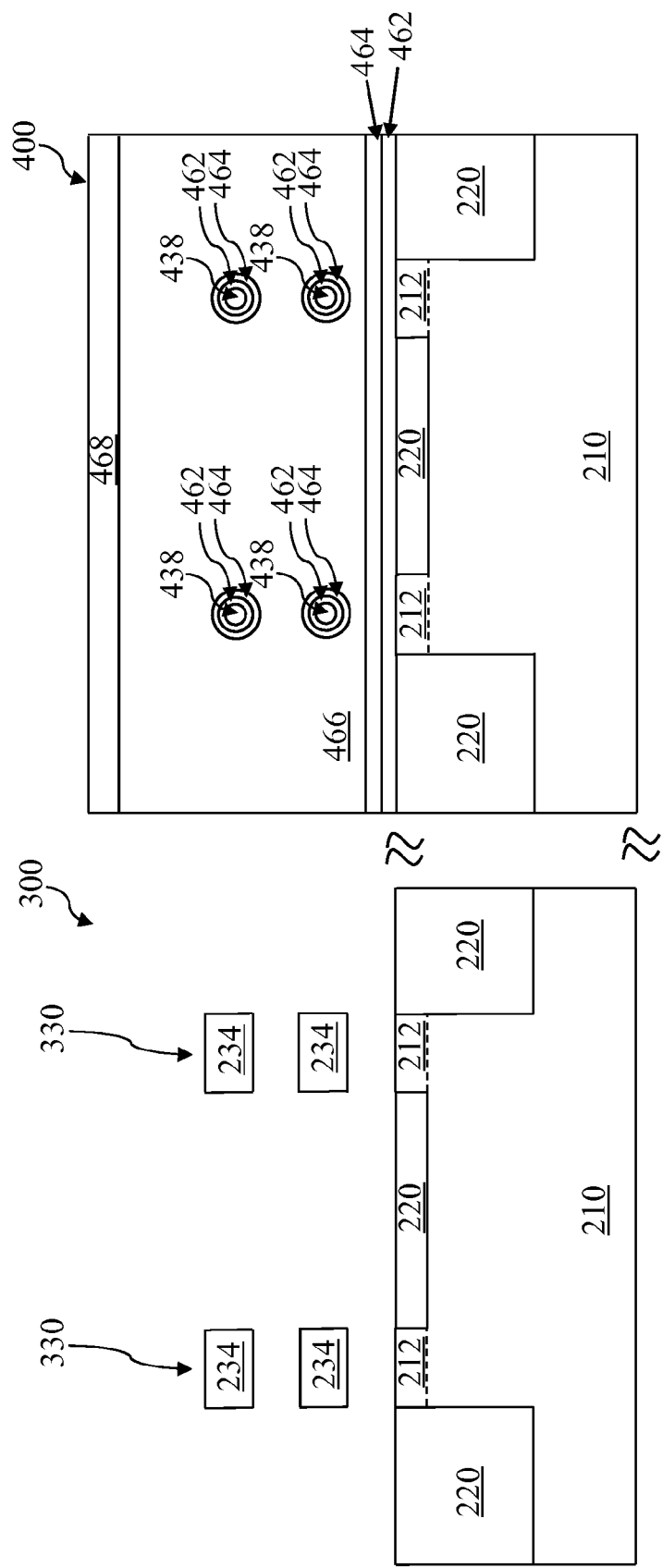

Referring to FIGS. 1 and 12A-12B, method 100 proceeds to step 122 by selectively removing the first layers 232 of NMOS region 300. In some embodiments, the first layers 232 may include SiGe, and the SiGe may be removed using any appropriate etching process, such as dry etching process, wet etching process, and/or combination thereof. The removing process of the first layers 232 may also include a selective wet etch or a selective dry etch, such that it offers adequate etch selectivity with respect to the second layers 234. In some examples, the selective wet etch or the selective dry etch may selectively remove the entire first layers 232. The dry and wet etching processes may have etching parameters that can be tuned, such as etchants used, etching temperature, etching solution concentration, etching pressure, source power, RF bias voltage, RF bias power, etchant flow rate, and other suitable parameters. Dry etching processes may include a biased plasma etching process that uses a chlorine-based chemistry. Other dry etchant gasses may include Tetrafluoromethane ($CF_4$), Chlorine trifluoride ($ClF_3$). Dry etching may also be performed anisotropically using such mechanisms as DRIE (deep reactive-ion etching). Chemical vapor etching may be used as a selective etching method, and the etchant gaseous may include hydrogen chloride (HCl), Tetrafluoromethane ($CF_4$), and gas mixture with hydrogen ($H_2$). Chemical vapor etching may be performed by Chemical Vapor Deposition (CVD) with suitable pressure and temperature.

Figure 13A:
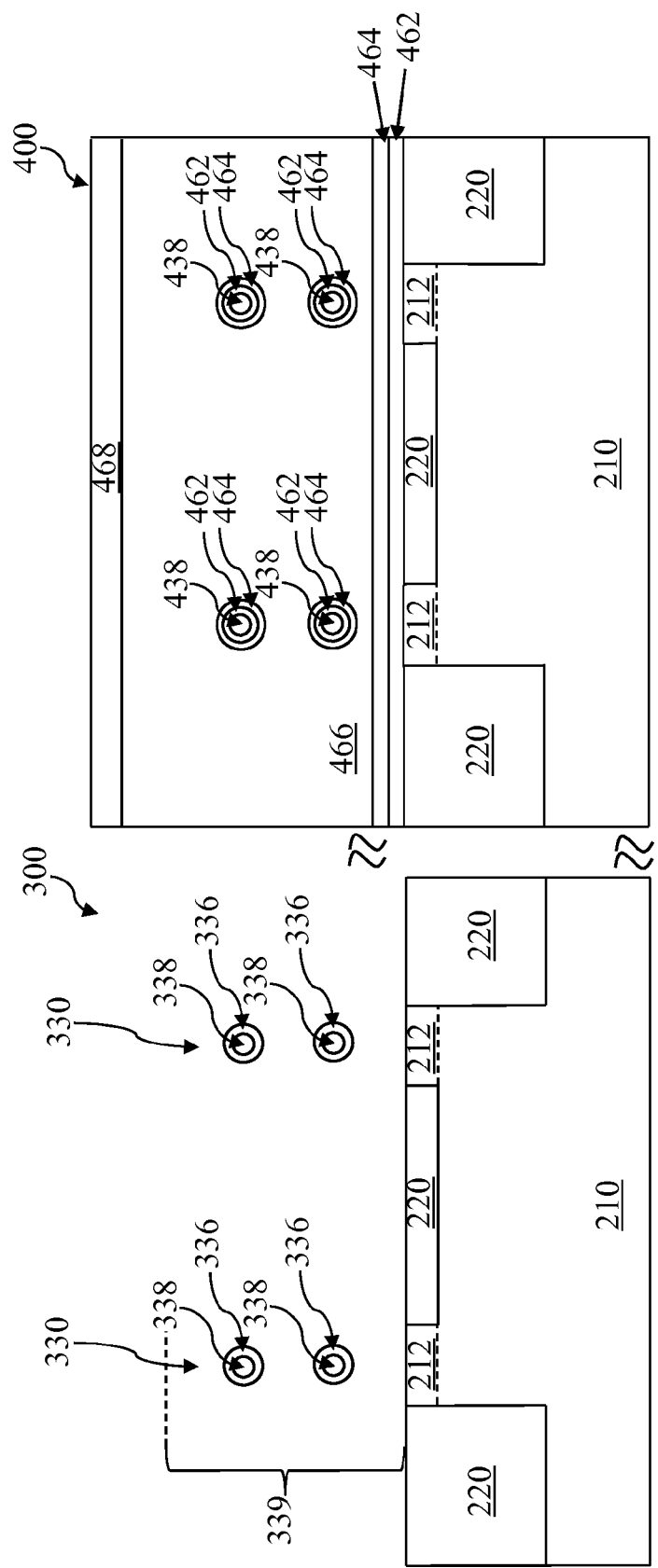
Figure 13B:
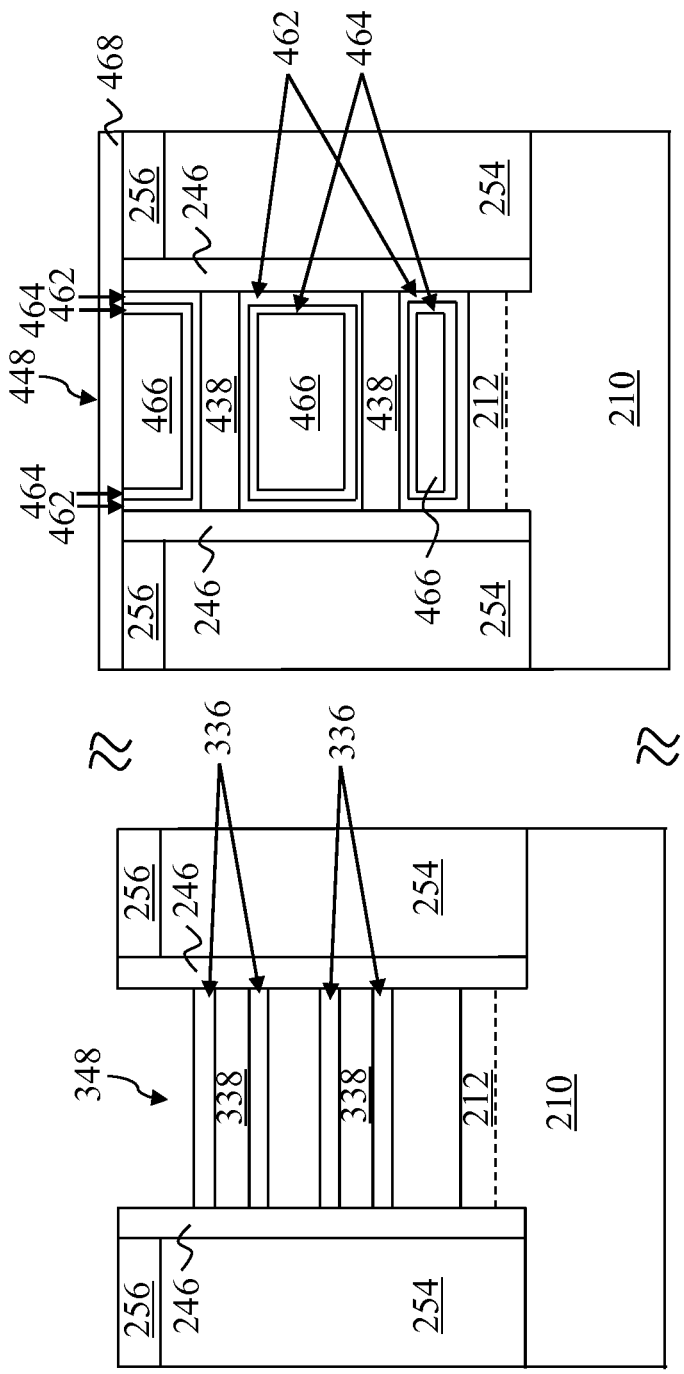

Referring to FIGS. 1 and 13A-13B, method 100 proceeds to step 124 by oxidizing the second layers 234 in gate region 348 of NMOS region 300 to form an outer oxide layer 336 and an inner semiconductor nanowire 338. In some examples, the thermal oxidation process is conducted in oxygen ambient. In some examples, the thermal oxidation process may be conducted in a combination of steam ambient and oxygen ambient. The thermal oxidation process may be conducted in a combination of steam ambient and oxygen ambient with one atmospheric pressure and a temperature in a range from 400° C. to 600° C. The thermal oxidation process may be conducted for 30-180 minutes.

During the thermal oxidation process, an outer portion of the second layer 234 may be oxidized to form an outer oxide layer 336. In some embodiments, outer semiconductor oxide layer 336 may include silicon oxide (SiOx), where x is oxygen composition in atomic percent. In some embodiments, an inner portion of the second layer 234 may diffuse to the inside of outer oxide layer 336 to form a semiconductor core 338 during the oxidation process. Semiconductor core portion 338 may be continuously along the line B-B direction (as shown in FIG. 2A), and connected to the crown-shaped source/drain features 254 on both sides of gate region 348. It is noted that the following discussion will now refer to semiconductor core portion 338 as an inner semiconductor nanowire 338. In some embodiments, the inner semiconductor nanowire 338 may be Si nanowire 338. The outer oxide layer 336 may be formed to wrap the inner semiconductor nanowire 338. In some embodiments, more than one inner semiconductor nanowire 338 may be formed in a nanowire set 339 in outer oxide layer 336.

Referring to FIGS. 13A-13B, in some examples, the diameter of inner semiconductor nanowire 338 may be in the range of 2-13 nm. The size and shape of the outer semiconductor oxide layer 336 and/or the inner semiconductor nanowire 338 may vary with different process conditions, such as thermal oxidation temperature and time.

Figure 14A:
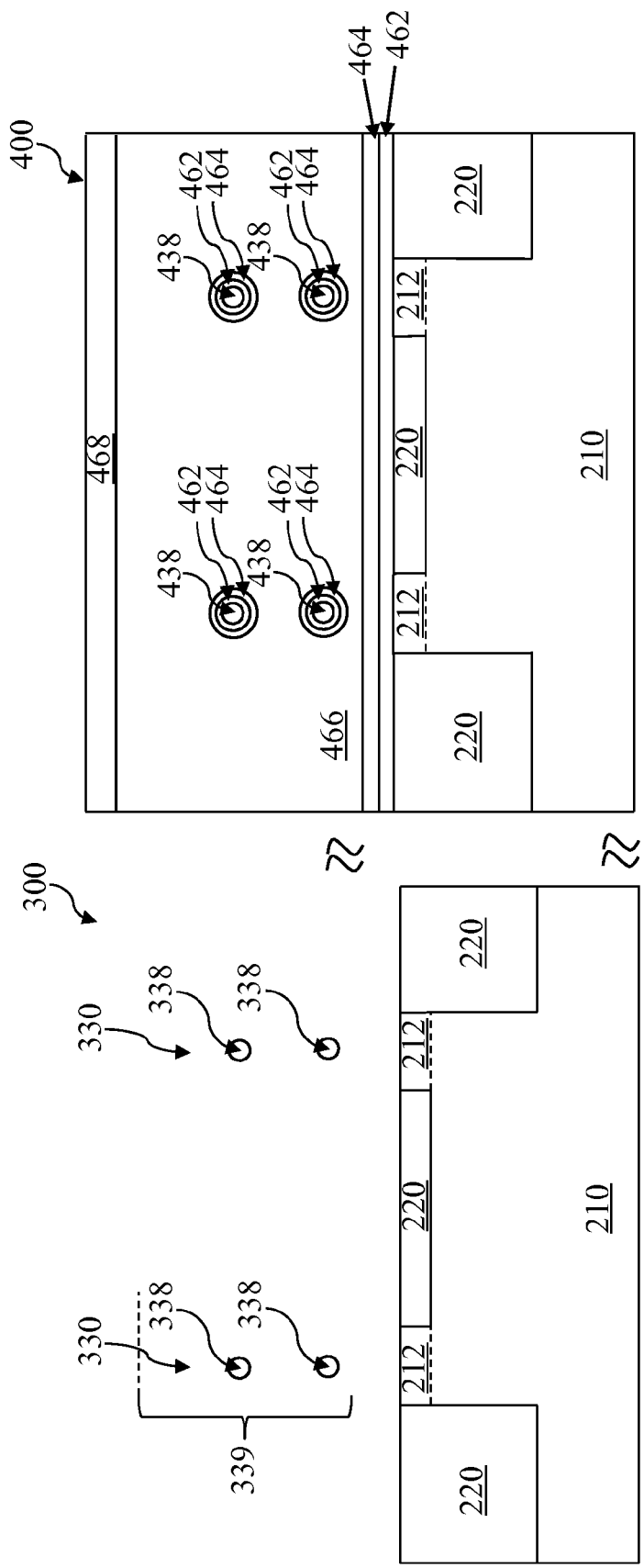
Figure 14B:
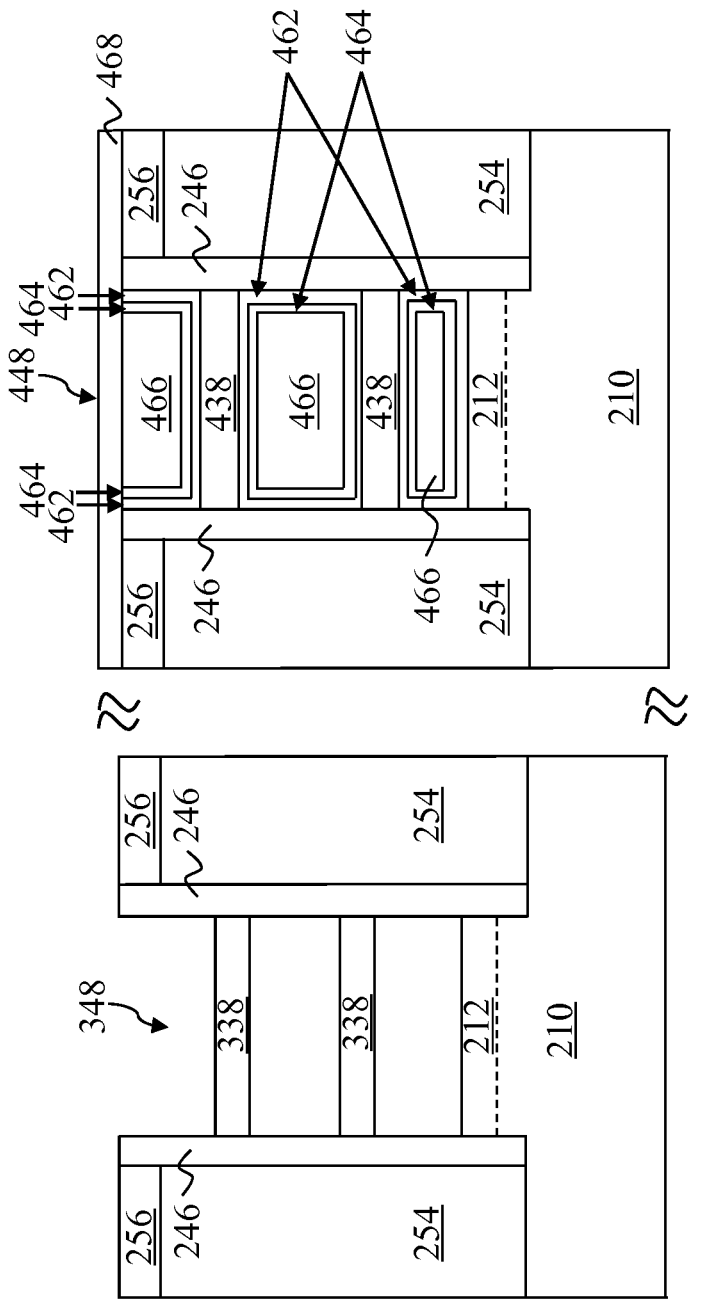

Referring to FIGS. 1 and 14A-14B, method 100 proceeds to step 126 by removing the outer oxide layer 336 to expose one or more inner semiconductor nanowires 338 in NMOS region 300. The removing process may include a dry etch, a wet etch, or a combination of. For example, a selective wet etch or a selective dry etch of outer oxide layer 336 is performed with adequate etch selectivity with respect to inner semiconductor nanowire 338. After removing the outer oxide layer 336, gate region 348 of NMOS 300 is configured to include one or more inner semiconductor nanowires 338 in nanowire set 339.

Figure 15A:
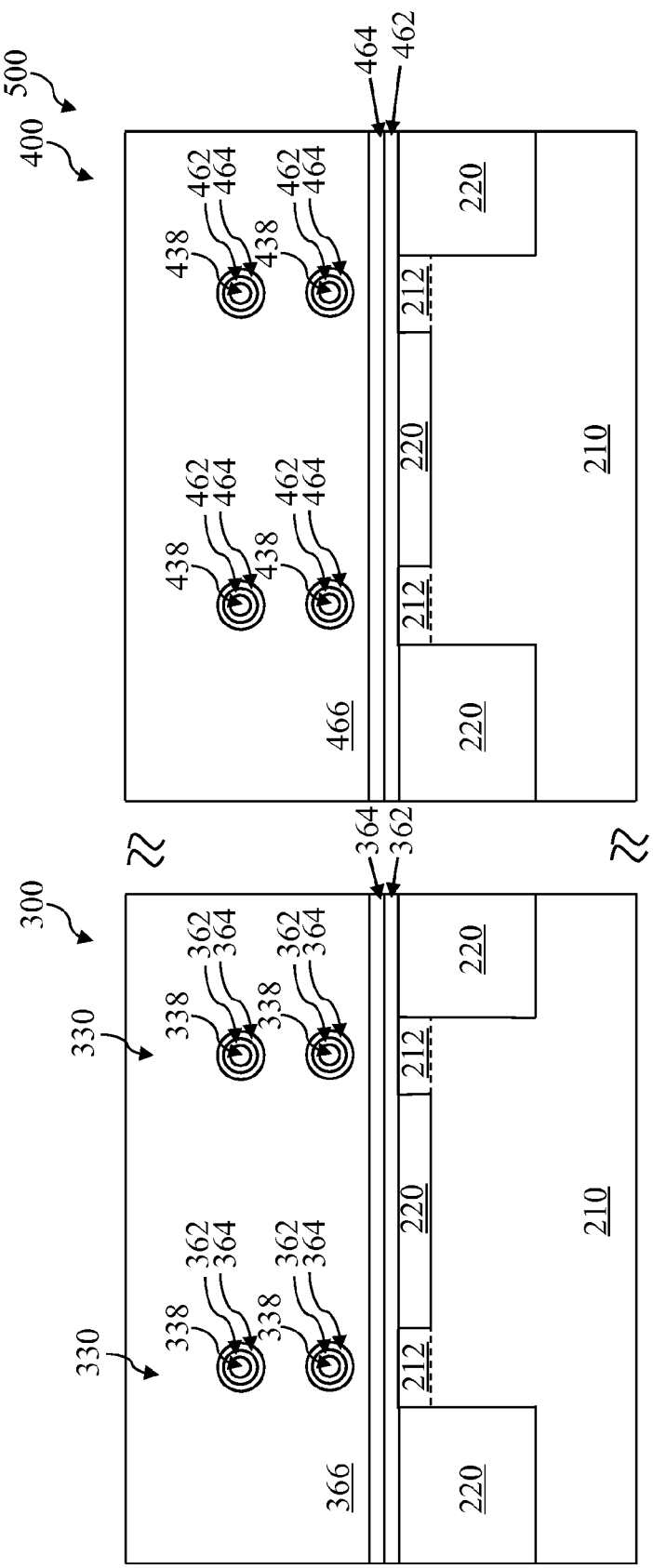
Figure 15B:
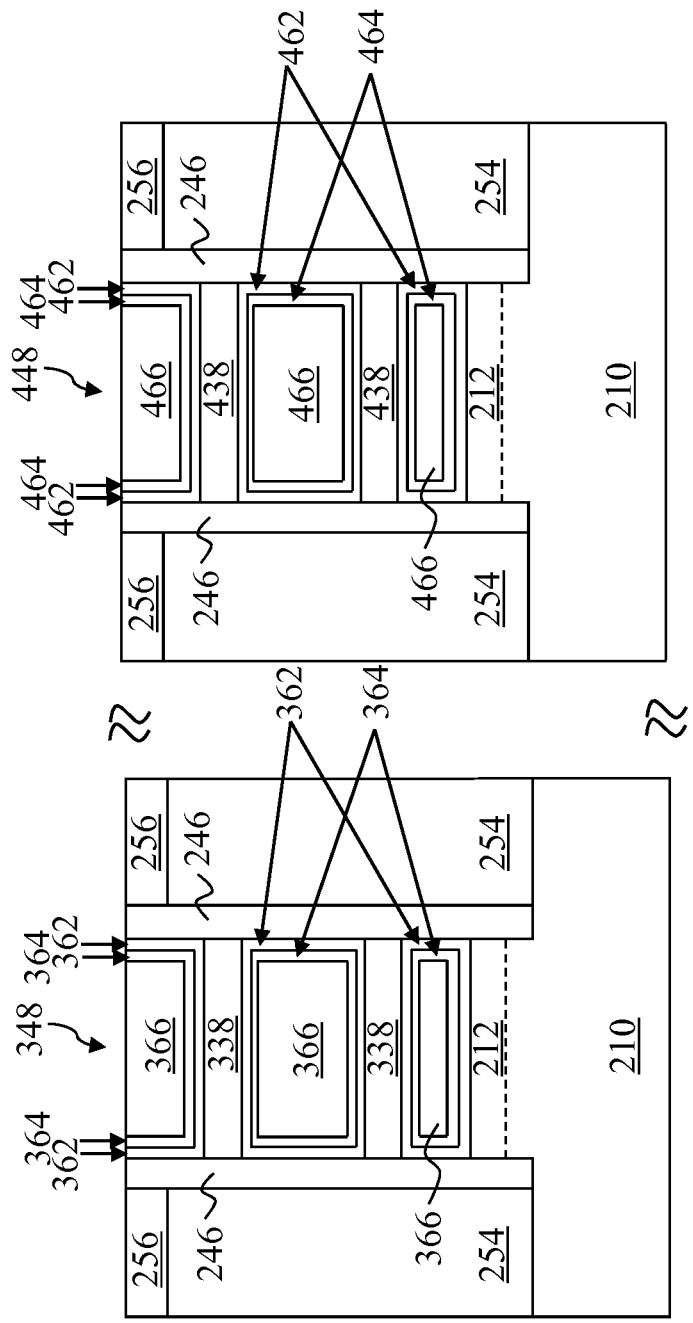

Referring to FIGS. 1 and 15A-15B, method 100 proceeds to step 128 by forming interfacial layer (IL) 362/high-k (HK) layer 364/metal gate (MG) 366 in NMOS region 300. One or more ILs 362 may be formed to wrap around one or more inner nanowires 338, and cover sidewall spacers 246. One or more HK dielectric layers 364 may be deposited over and wrapping around ILs 362. The formation processes and materials used to form IL 362, HK dielectric layer 364 and MG layer 366 may be substantially similar to the formation processes and materials used to form IL 462, HK dielectric layer 464 and MG layer 466, as described in FIGS. 10A-10B. In some embodiments, the interface between the IL 362 and the isolation region 220 may not be observed after the thermal treatment. The interface between the IL 362 and the HK dielectric layer 364 may not be observed after the thermal treatment. After depositing IL 362/HK layer 364/MG 366, gate region 348 may include one or more inner semiconductor nanowires 338, and IL 362/HK layer 364/MG 366.

Still referring to FIGS. 1 and 15A-15B, at step 128, hard mask 468 covering PMOS region 400 may be removed. In some embodiments, hard mask 468 may be removed during the planarization of the surface of NMOS region 300 using a CMP process.

Although according to the illustrations in FIGS. 7-15, the nanowire structure in PMOS region 400 are formed prior to the formation of the nanowire structure in NMOS region 300, the nanowire structure in NMOS region 300 may be formed prior to the formation of the nanowire structure in PMOS region 400. In some embodiments, a hard mask may be first formed to cover PMOS region 400 during the formation of the nanowire in NMOS region 300. In some embodiments, the nanowire structure may be only formed in NMOS region 300. In some embodiments, the nanowire structure may be only formed in PMOS region 400. In some embodiments, there is more than one nanowire formed in NMOS region 300 and/or PMOS region 400. A person having ordinary skill in the art would be able to understand that NMOS region 300 and PMOS region 400 may be formed using any suitable processes in any appropriate order and in any proper topology.

In some embodiments, MG layer 366 of NMOS region 300 may also include a first capping layer wrapping around IL 362/HK layer 364 structure. A first barrier MG and n-type work function (NWF) MG may be further formed to wrap around the first capping layer. MG layer 466 of PMOS region 400 may also include a second capping layer wrapping around IL462/HK layer 464 structure. A second barrier MG and p-type work function (PWF) MG may be further formed to wrap around the second capping layer. The first and/or second capping layer may include TiN. The first and/or second barrier MG may include TaN. The NWF MG of NMOS region 200 may be formed using different metal layers from the PWF MG layer of PMOS region 300. In some examples, the NWF MG may include TiAlC, TaAl, and/or TiAl. The PWF MG may include TiN.

NMOS region 300 and/or PMOS region 400 of IC device 500 may undergo further CMOS or MOS technology processing to form various features and regions known in the art. For example, subsequent processing may form various contacts/vias/lines and multilayers interconnect features (e.g., metal layers and interlayer dielectrics) on substrate 210, configured to connect the various features or structures of IC device 500. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional steps can be provided before, during, and after method 100, and some of the steps described can be replaced or eliminated for other embodiments of the method.

The present disclosure provides many different embodiments of a method for fabricating an integrated circuit (IC) device. The method includes providing a precursor. The precursor includes a substrate having first and second metal-oxide-semiconductor (MOS) regions; first gate and source/drain regions formed in the first MOS region, the first gate region including a semiconductor layer stack; and second gate and source/drain regions formed in the second MOS region, the second gate region including the semiconductor layer stack. The semiconductor layer stack includes one or more first layers and one or more second layers alternatingly disposed over the substrate. The method further includes laterally exposing the semiconductor layer stack in the first gate region; oxidizing the semiconductor layer stack in the first gate region to form first outer oxide layer and inner nanowire set, a first nanowire in the first inner nanowire set extending from the first source region to the corresponding first drain region; removing the first outer oxide layer to expose the first inner nanowire set in the first gate region; forming a first high-k/metal gate (HK/MG) stack wrapping around the first inner nanowire set; laterally exposing the semiconductor layer stack in the second gate region; oxidizing the semiconductor layer stack in the second gate region to form second outer oxide layer and inner nanowire set, a second nanowire in the second inner nanowire set extending from the second source region to the second drain region; removing the second outer oxide layer to expose the second inner nanowire set in the second gate region; and forming a second HK/MG stack wrapping around the second inner nanowire set.

In another embodiment, an IC device includes a substrate having an N-type metal-oxide-semiconductor (NMOS) region and a P-type metal-oxide-semiconductor (PMOS) region; a first gate region, and a first source feature separated from a corresponding first drain feature by the first gate region in the NMOS region; and a second gate region, and a second source feature separated from a corresponding second drain feature by the second gate region in the PMOS region. The first gate region includes a plurality of first nanowire sets having a first semiconductor material. The first nanowire sets extend from the first source feature to the corresponding first drain feature. The second gate region includes a plurality of second nanowire sets having a second semiconductor material. The second nanowire sets extend from the second source feature to the corresponding second drain feature. Each of the NMOS region and PMOS region includes at least one intra-isolation region between nanowire sets, and at least one inter-isolation region at one side of each of the NMOS region and PMOS region. A depth of the inter-isolation region is greater than a depth of the intra-isolation region In yet another embodiment, an IC device includes a substrate including a metal-oxide-semiconductor (MOS) region; a gate region disposed over the substrate; and a source separated from a corresponding drain feature by the gate region. The gate region includes a plurality of nanowire sets extending from the source feature to the corresponding drain feature. The nanowire sets include a semiconductor material selected from a group consisting of Si and SiGe. The MOS region includes at least one intra-isolation region between the nanowire sets, and at least one inter-isolation region at one side of the MOS region. A depth of the inter-isolation region is greater than a depth of the intra-isolation region The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit device comprising:
a substrate having an N-type metal-oxide-semiconductor (NMOS) region and a P-type metal-oxide-semiconductor (PMOS) region;
a first gate region and a first source feature separated from a corresponding first drain feature by the first gate region in the NMOS region; and
a second gate region and a second source feature separated from a corresponding second drain feature by the second gate region in the PMOS region,
wherein the first gate region includes a plurality of first nanowire sets having a first semiconductor material, the first nanowire sets extending from the first source feature to the corresponding first drain feature,
wherein the second gate region includes a plurality of second nanowire sets having a second semiconductor material, the second nanowire sets extending from the second source feature to the corresponding second drain feature,
wherein each of the NMOS region and PMOS region includes at least one intra-isolation region between nanowire sets and at least one inter-isolation region at one side of each of the NMOS region and PMOS region, wherein a depth of the inter-isolation region is greater than a depth of the intra-isolation region, and
wherein an anti-punch through feature is disposed in the substrate under one of the first nanowire sets from the plurality of first nanowire sets and a sidewall spacer extends along a sidewall of the anti-punch through feature.

2. The device of claim 1, wherein the first semiconductor material includes Si.

3. The device of claim 1, wherein the second semiconductor material includes SiGe.

4. The device of claim 1, further comprising:
a first anti-punch through (APT) region formed below the first nanowire sets, the first APT implanted with p-type dopants; and
a second APT region formed below the second nanowire sets, the second APT implanted with n-type dopants.

5. The device of claim 1, wherein the depth of the intra-isolation is in the range of about 40 nm to about 60 nm.

6. The device of claim 1, wherein the depth of the inter-isolation is in the range of about 60 nm to about 120 nm.

7. A device comprising:
a first nanowire extending from a first source/drain feature to a second source/drain feature;
a first gate dielectric layer wrapping around the first nanowire;
a second nanowire extending from the first source/drain feature to the second source/drain feature;
a second gate dielectric layer wrapping around the second nanowire;
a metal gate electrode wrapping around the first and second gate dielectric layers and extending from the first gate dielectric layer to the second gate dielectric layer;
a first dielectric isolation feature disposed in a substrate between the first and second nanowires and extending to a first depth within the substrate;
a second dielectric isolation feature disposed in the substrate adjacent the first nanowire and extending to a second depth within the substrate, the second depth being different than the first depth;
a first anti-punch through feature disposed in the substrate directly under the first nanowire, wherein the first anti-punch through feature extends continuously from the first dielectric isolation feature to the second dielectric isolation feature, and a sidewall spacer extending along a sidewall of the first anti-punch through feature.

8. The device of claim 7, wherein the first nanowire is formed of Si.

9. The device of claim 7 wherein the first nanowire is formed of Ge.

10. The device of claim 7, further comprising:
a third dielectric isolation feature disposed in the substrate adjacent the second nanowire and extending to the second depth within the substrate; and
a second anti-punch through feature disposed in the substrate directly under the second nanowire, wherein the second anti-punch through feature extends continuously from the third dielectric isolation feature to the first dielectric isolation feature.

11. The device of claim 7, further comprising an interlayer dielectric layer disposed over the first source/drain feature and having a top surface facing away from the substrate, and
wherein a top surface of the metal gate electrode is substantially coplanar with the top surface of the interlayer dielectric layer.

12. The device of claim 7, wherein the first nanowire physically contacts the sidewall spacer.

13. The device of claim 7, further comprising a second anti-punch through feature disposed in the substrate directly under the second nanowire; and
another sidewall spacer extending along a sidewall of the second anti-punch through feature.

14. The device of claim 7, wherein the first nanowire is formed of a different material than the second nanowire.

15. A device comprising:
a first nanowire extending from a first source/drain feature to a second source/drain feature, wherein the first nanowire is formed of a first material that includes germanium;
a first gate dielectric layer wrapping around the first nanowire;
a second nanowire extending from a third source/drain feature to a fourth source/drain feature, wherein the second nanowire is formed of a second material that includes silicon, the second material being different than the first material;
a second gate dielectric layer wrapping around the second nanowire;
a first metal gate electrode wrapping around the first dielectric layer;
a second metal gate electrode wrapping around the second dielectric layer;
a first dielectric isolation feature disposed in a substrate between the first and second nanowires and extending to a first depth within the substrate;
a second dielectric isolation feature disposed in the substrate adjacent one of the first and second nanowires and extending to a second depth within the substrate, the second depth being different than the first depth;
a first anti-punch through feature disposed in the substrate directly under the first nanowire, wherein the first anti-punch through feature extends continuously from the first dielectric isolation feature to the second dielectric isolation feature; and
a sidewall spacer extending along a sidewall of the first anti-punch through feature.

16. The device of claim 15, further comprising:
a third nanowire extending from the first source/drain feature to the second source/drain feature, wherein the third nanowire is formed of the first material that includes germanium; and
a third gate dielectric layer wrapping around the third nanowire, and
wherein the first metal gate electrode wraps around the third gate dielectric layer and extends continuously from the first gate dielectric layer to the third gate dielectric layer.

17. The device of claim 15, further comprising:
a third nanowire extending from the third source/drain feature to the fourth source/drain feature, wherein the third nanowire is formed of the second material that includes silicon; and
a third gate dielectric layer wrapping around the third nanowire, and
wherein the second metal gate electrode wraps around the third gate dielectric layer and extends continuously from the second gate dielectric layer to the third gate dielectric layer.

18. The device of claim 15, further comprising a third dielectric isolation feature disposed in the substrate adjacent the first nanowire and extending to the first depth within the substrate.

19. The device of claim 18, further comprising an interlayer dielectric layer disposed over the first source/drain feature, and
wherein a top surface of the first metal gate electrode is not covered by the interlayer dielectric layer.

20. The device of claim 18, further comprising a second anti-punch through feature disposed in the substrate directly under the second nanowire; and
another sidewall spacer extending along a sidewall of the second anti-punch through feature.

* * * * *